US009437797B2

United States Patent
Matsumoto et al.

(10) Patent No.: US 9,437,797 B2
(45) Date of Patent: Sep. 6, 2016

(54) COOLING STRUCTURE OF HEATING ELEMENT AND POWER CONVERSION DEVICE

(71) Applicant: Hitachi, Ltd., Chiyoda-ku, Tokyo (JP)

(72) Inventors: Daisuke Matsumoto, Tokyo (JP); Akira Mima, Tokyo (JP); Tetsuya Kawashima, Tokyo (JP); Yuuichi Mabuchi, Tokyo (JP); Yukio Hattori, Tokyo (JP); Hiroshi Kamizuma, Tokyo (JP); Ryouhei Miyagawa, Tokyo (JP); Tomonori Ichikawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/818,962

(22) Filed: Aug. 5, 2015

(65) Prior Publication Data

US 2016/0093788 A1 Mar. 31, 2016

(30) Foreign Application Priority Data

Sep. 29, 2014 (JP) ................................ 2014-198049

(51) Int. Cl.
*H05K 7/20* (2006.01)
*H01L 35/32* (2006.01)
(Continued)

(52) U.S. Cl.
CPC ............... *H01L 35/32* (2013.01); *H01L 23/40* (2013.01); *H01L 35/04* (2013.01)

(58) Field of Classification Search
CPC ............... H05K 7/20; H05K 7/20309; H05K 7/20936; F28F 3/02; F28F 3/08; F28F 7/00; F28D 15/00; F28D 15/26; H01L 23/34; H01L 23/473; H01L 23/4735; H02M 7/00; H02M 7/003; B60L 11/14; G06F 1/20; G06F 1/203; G06F 1/206

USPC ............... 361/679.46–679.54, 688, 689, 698, 361/699, 700–712, 715, 719–724; 165/80.2–80.5, 104.33, 104.34, 165/104.19, 104.26, 185; 174/15.1, 15.2, 174/16.3, 520; 257/706–727; 363/40, 55, 363/56.01, 71, 72, 98, 109, 120, 131, 132, 363/141, 144–147; 62/3.3, 259.2, 3.7, 113, 62/114, 117, 61, 79
See application file for complete search history.

(56) References Cited

U.S. PATENT DOCUMENTS

| 3,746,947 A * | 7/1973 | Yamamoto | ............ H01L 23/051 257/689 |
|---|---|---|---|
| 4,765,400 A | 8/1988 | Chu et al. | |

(Continued)

FOREIGN PATENT DOCUMENTS

| JP | 62-96855 | 6/1987 |
|---|---|---|
| JP | 63-263750 A | 10/1988 |

(Continued)

OTHER PUBLICATIONS

Corresponding Japanese Office Action dated May 19, 2015 with English translation.

(Continued)

*Primary Examiner* — Michail V Datskovskiy
(74) *Attorney, Agent, or Firm* — Crowell & Moring LLP

(57) ABSTRACT

A cooling structure of a heating element includes: the heating element having at least one cooling surface from which a plurality of pin fins project; a heat receiving plate which has a shape complying with the cooling surface and in which holes are formed at positions facing each pin fin, each pin fin being movably inserted into the holes; a cooler which has a pair of clamping members that sandwich therebetween the heating element and the heat receiving plate while pressing the heating element and the heat receiving plate, and which cools the heat receiving plate; and a space securing part which is provided on the heat receiving plate and suppresses a distance between the pair of clamping members so as not to apply a pressing force by the clamping members to the heating element.

13 Claims, 21 Drawing Sheets

(51) Int. Cl.
  *H01L 35/04* (2006.01)
  *H01L 23/40* (2006.01)
  *G06F 1/20* (2006.01)
  *H02M 1/00* (2006.01)

(56) References Cited

U.S. PATENT DOCUMENTS

| | | | |
|---|---|---|---|
| 6,223,815 B1 | 5/2001 | Shibasaki | |
| 6,233,815 B1 * | 5/2001 | Miyake | B29C 45/006 |
| | | | 29/783 |
| 6,729,383 B1 * | 5/2004 | Cannell | F28F 3/022 |
| | | | 165/185 |
| 7,215,545 B1 * | 5/2007 | Moghaddam | H01L 23/3732 |
| | | | 165/185 |
| 7,578,337 B2 | 8/2009 | Spokoiny | H05K 7/20254 |
| | | | 165/109.1 |
| 7,849,914 B2 * | 12/2010 | Di Stefano | H01L 23/473 |
| | | | 165/46 |
| 7,968,925 B2 * | 6/2011 | Tokuyama | H01L 23/473 |
| | | | 257/299 |
| 8,391,008 B2 * | 3/2013 | Dede | H01L 23/4735 |
| | | | 165/104.21 |
| 8,587,977 B2 * | 11/2013 | Nishikimi | H05K 7/20927 |
| | | | 361/679.46 |
| 8,957,316 B2 * | 2/2015 | Fields | H01L 23/373 |
| | | | 174/178 |
| 9,241,429 B2 * | 1/2016 | Kaneko | H02M 7/003 |
| 2008/0047694 A1 * | 2/2008 | Delano | F28F 3/022 |
| | | | 165/104.33 |
| 2009/0194862 A1 * | 8/2009 | Kitami | H01L 23/3185 |
| | | | 257/690 |
| 2011/0057303 A1 | 3/2011 | Rancuret et al. | |
| 2014/0168901 A1 | 6/2014 | Ide et al. | |

FOREIGN PATENT DOCUMENTS

| | | | | |
|---|---|---|---|---|
| JP | 1-58952 U | 4/1989 | | |
| JP | 5-74988 A | 3/1993 | | |
| JP | 5-73961 U | 10/1993 | | |
| JP | 2000-269671 A | 9/2000 | | |
| JP | 2006-108239 A | 4/2006 | | |
| JP | 2009-130224 | 6/2009 | | |
| JP | 2010-278108 A | 12/2010 | | |
| JP | 2013-73964 A | 4/2013 | | |
| JP | 2013239676 A | * | 11/2013 | H05K 7/20 |
| JP | 2014-67897 A | 4/2014 | | |

OTHER PUBLICATIONS

Japanese Office Action issued in counterpart Japanese Application No. 2015-172477 dated Oct. 6, 2015, with English translation (eight (8) pages).

* cited by examiner

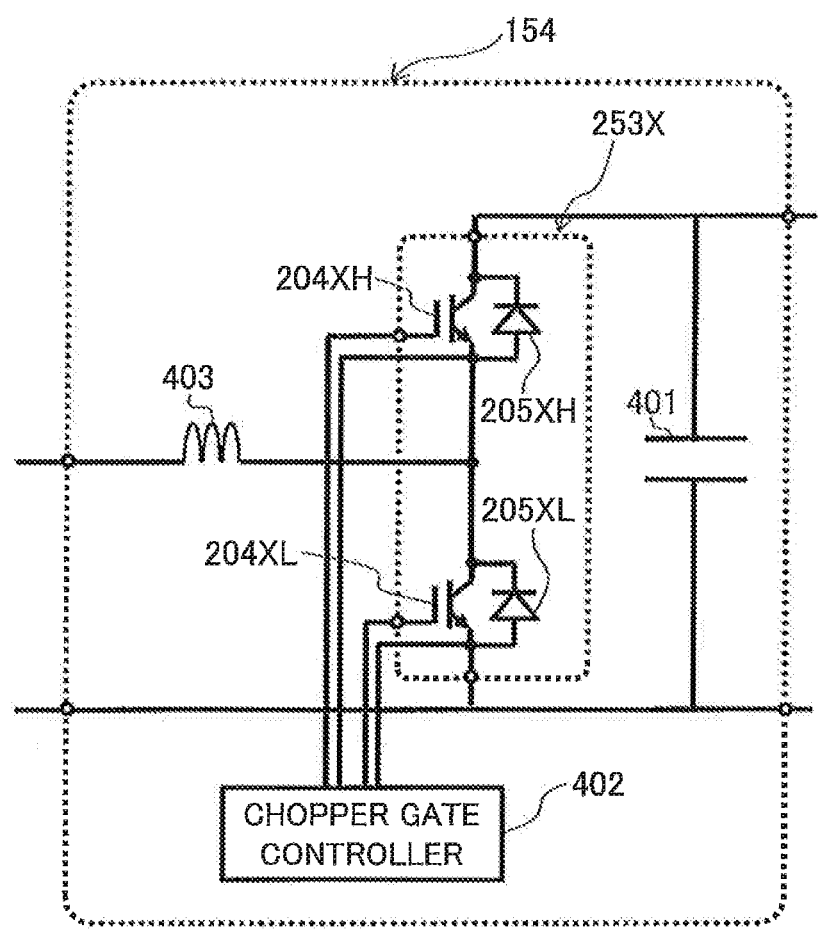

COOLING STRUCTURE OF HEATING ELEMENT AND POWER CONVERSION DEVICE

CROSS-REFERENCE TO RELATED APPLICATION

This application is based upon and claims the benefit of priority to the Japanese Patent Application No. 2014-198049, filed on Sep. 29, 2014, the entire contents of which are incorporated herein by reference.

BACKGROUND OF THE INVENTION

1. Field of the Invention

The present invention relates to a cooling structure of a heating element and a power conversion device.

2. Description of the Related Art

Patent Document 1 (Japanese Patent Application Publication No. 2013-073964) discloses in paragraph [0001] "The invention relates to a power module that has good heat dissipation and reliability", and in paragraph [0011] "A heat dissipating portion 307A is provided on one of two surfaces of the flat case that have wide areas and face each other, and a heat dissipating portion 307B is provided on the other surface. The heat dissipating portion 307A and the heat dissipating portion 307B function as heat dissipating walls of the module case 304, and two or more fins 305 are uniformly formed on the outer circumferential surfaces".

Meanwhile, there is a desire to use a heating element such as a semiconductor module that has been originally designed as a water-cooled one, as an air-cooled one. This is for reasons that adoption of an air-cooled one makes piping for refrigerant and the like unnecessary, thereby having an advantage in maintenance. On the other hand, adoption of the air-cooled one requires attachment of an external cooling fin having a certain degree of size and the like to the heating element. However, a heating element that has been originally designed as a water-cooled one does not assume application of a strong pressing force thereto because the heating element does not assume attachment of an external cooling fin thereto while having small pin fins (fins each projecting in the form of a pin) or the like. Accordingly, when attempting to simply attach an external cooling fin to the heating element by bolting or the like, there is a possibility that the heating element is broken.

SUMMARY OF THE INVENTION

The present invention has been made in view of the above circumstances, and an object of the invention is to provide a cooling structure of a heating element and a power conversion device that are capable of cooling the heating element such as a semiconductor module having pin fins while preventing breakage of the heating element.

In order to solve the above problems, the present invention provides, as one aspect thereof, a cooling structure of a heating element, including: the heating element having at least one cooling surface from which a plurality of pin fins project; a heat receiving plate which has a shape complying with the cooling surface and in which holes are formed at positions facing each of the pin fins, each of the pin fins being movably inserted into the holes; a cooler which has a pair of cramping members that sandwich therebetween the heating element and the heat receiving plate while pressing the heating element and the heat receiving plate, and which cools the heat receiving plate; and a space securing part which is provided on the heat receiving plate and suppresses a distance between the pair of clamping members so as not to apply a pressing force by the clamping members to the heating element.

Moreover, the present invention provides, as another aspect thereof, a power conversion device including: a plurality of semiconductor devices for the power conversion device, each semiconductor device having cooling surfaces from which a plurality of pin fins project, on both opposite surfaces thereof, and having electric terminals on one side surface which abuts on the cooling surfaces; a plurality of heat receiving plates each of which has a shape complying with a corresponding one of the cooling surfaces, in each of which holes are formed at positions facing each pin fin, each pin fin being movably inserted into the holes, and each of which is attached to the corresponding cooling surface; a plurality of coolers including a plurality of clamping members that sandwich therebetween the plurality of semiconductor devices for the power conversion device and the plurality of heat receiving plates while pressing the semiconductor devices and the heat receiving plates, a plurality of heat dissipating fins that lie next to each other in a horizontal direction relative to each of the semiconductor devices for the power conversion device, and at least one heat pipe that connects each of the clamping members with a corresponding plurality of heat dissipating fins, the plurality of coolers cooling the plurality of heat receiving plates, respectively; and a plurality of space securing parts which are provided for each of the plurality of heat receiving plates and suppress distances between the clamping members so as not to apply a pressing force by the clamping members to the semiconductor devices for the power conversion device, wherein the side surfaces on which the plurality of semiconductor devices for the power conversion device have the electric terminals are arranged on the same plane, and cooling wind is fed by a blower to the plurality of heat dissipating fins from a reverse side of the same plane.

According to the present invention, the heating element having pin fins can be cooled while preventing breakage thereof.

BRIEF DESCRIPTION OF THE DRAWINGS

FIG. 4 is a circuit diagram of a chopper in the power conversion device.

DETAILED DESCRIPTION OF THE INVENTION

<Electrical Configuration of Power Conversion Device>

Description will be hereinafter given of a configuration of a power conversion device 150 according to an embodiment of the present invention.

Figure 1:
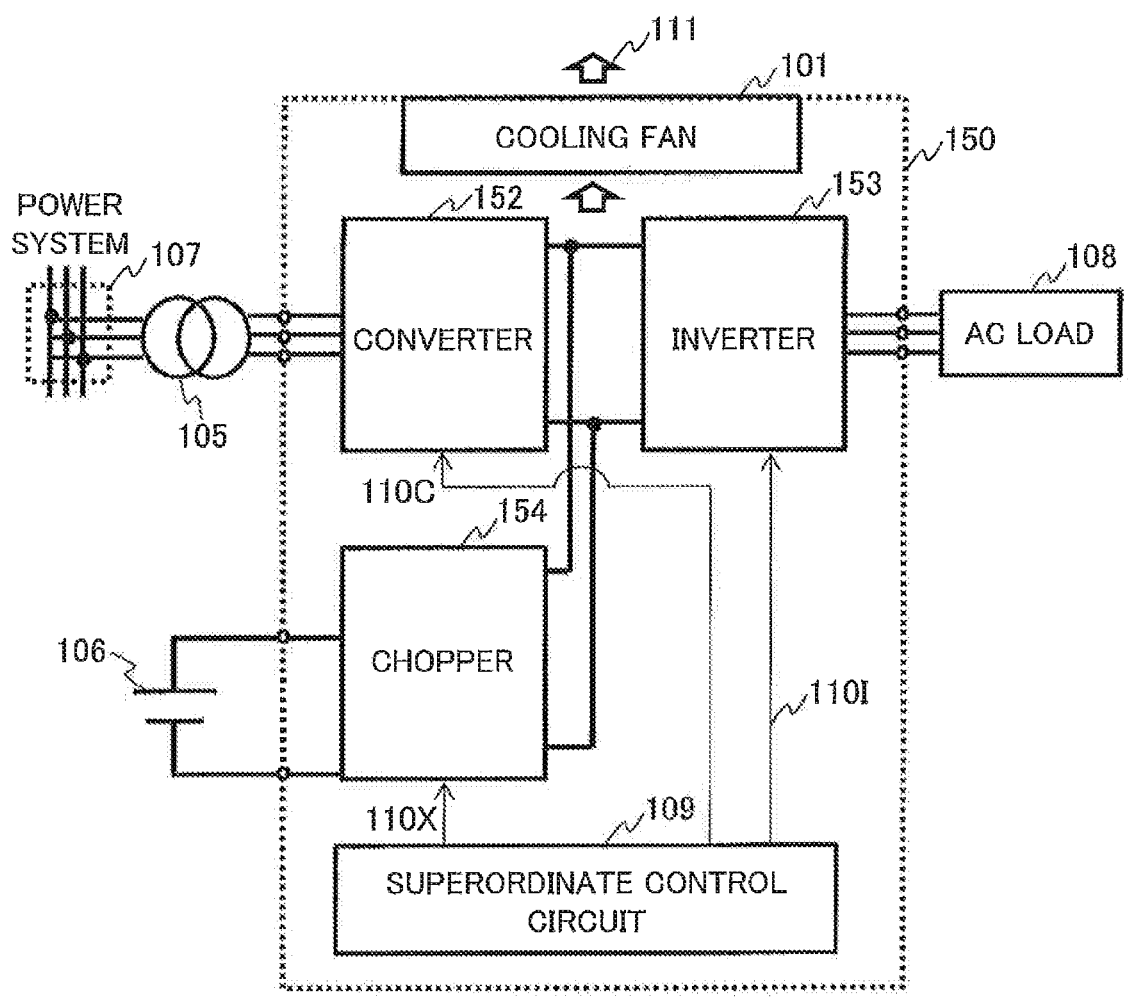
FIG. 1 is a circuit diagram of a power conversion device according to an embodiment of the present invention.

FIG. 1 is a circuit diagram of the power conversion device 150 according to the present embodiment. As shown in FIG. 1, alternating current (AC) power is supplied to the power conversion device 150, which is regulated to a proper voltage through a transformer 105 from a power receiving point 107 in a power system. The AC power supplied is input to a converter 152 to be converted into direct current (DC) power. The DC power is input to an inverter 153 to be converted into AC power. This AC power is consumed in a three-phase AC load 108.

On the other hand, where power is not supplied to the converter 152 due to failure or the like in the power system, a superordinate control circuit 109 detects non-supply of the power to activate a chopper 154. DC power input to the chopper 154 from a storage cell 106 is regulated to a proper power through the chopper 154 and then input to the inverter 153. The DC power input to the inverter 153 is converted into AC power, which is consumed in the three-phase AC load 108.

The operation described above is regulated by an instruction signal 110C to the converter 152, an instruction signal 110I to the inverter 153, and an instruction signal 110X to the chopper 154, which are output depending on an intended operation determined by the superordinate control circuit 109. The converter 152, the inverter 153 and the chopper 154 generate heat in the respective operations to increase temperatures thereof. In order to suppress the temperature increase, cooling wind 111 generated by a cooling fan 101 (blower) is fed into the converter 152, the inverter 153 and the chopper 154 for cooling. Of the electric system configured as described above, the cooling fan 101, the converter 152, the inverter 153, the chopper 154 and the superordinate control circuit 109 are provided in the power conversion device 150 in the present embodiment. Moreover, a filter circuit may be arranged between the converter 152 and transformer 105, or between the inverter 153 and the AC load 108, if necessary.

Figure 2:
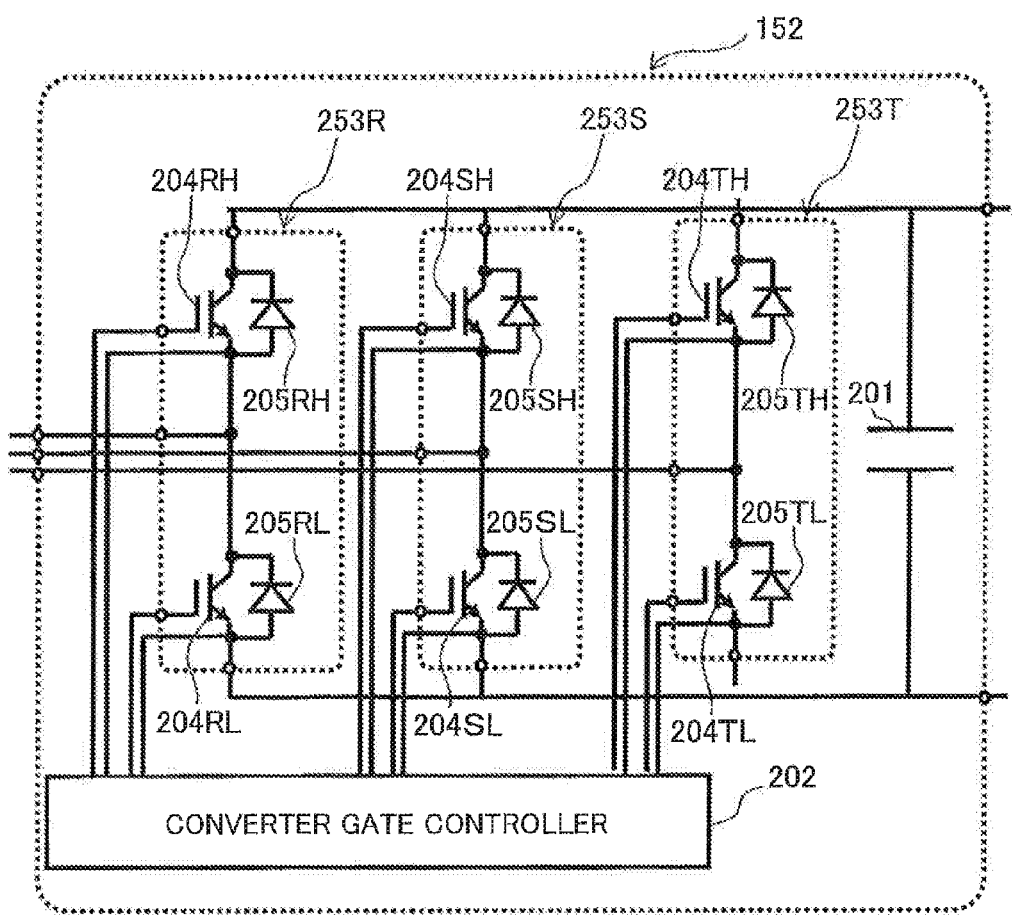
FIG. 2 is a circuit diagram of a converter in the power conversion device.
Figure 3:
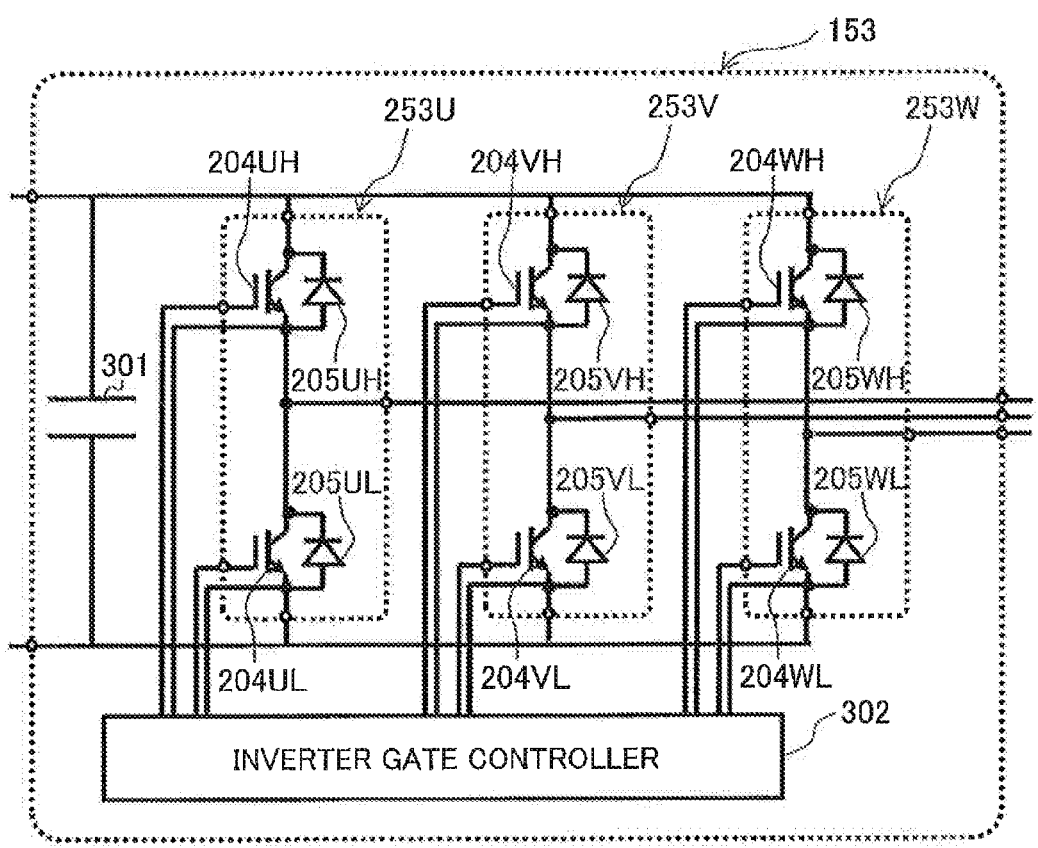
FIG. 3 is a circuit diagram of an inverter in the power conversion device.

FIG. 2 is a circuit diagram of the converter 152 in the power conversion device 150; FIG. 3 is a circuit diagram of the inverter 153 in the power conversion device 150; and FIG. 4 is a circuit diagram of the chopper 154 in the power conversion device 150. Circuits of the converter 152, the inverter 153 and the chopper 154 will be hereinafter described with reference to FIGS. 2 to 4.

The converter 152 shown in FIG. 2 is constituted by legs 253 (253R, 253S, 253T) each comprised of a plurality of semiconductor elements, and each leg 253 is constituted by a plurality of switching elements 204 (e.g., 204RH, 204RL) and a plurality of diode elements 205 (e.g., 205RH, 205RL). In the description below, the leg 253, the switching element 204 and the diode element 205 are used collectively as representing the entirety of respective components.

Both ends of the leg 253 are connected to a capacitor 201. An upper side arm of the leg 253R is constituted by a switching element 204RH and a diode element 205RH for return current. Also, a lower side arm of the leg 253R is constituted by a switching element 204RL and a diode element 205RL for return current. In the same manner, an upper side arm of the leg 253S is constituted by a switching element 204SH and a diode element 205SH for return current. Also, a lower side arm of the leg 253S is constituted by a switching element 204SL and a diode element 205SL for return current. Moreover, an upper side arm of the leg 253T is constituted by a switching element 204TH and a diode element 205TH for return current. Also, a lower side arm of the leg 253T is constituted by a switching element 204TL and a diode element 205TL for return current. Switching signals to the switching elements 204RH, 204RL, 204SH, 204SL, 204TH and 204TL are controlled by a converter gate controller 202 which is a subordinate controller.

Note that any device as long as it is an element capable of switching between conduction (ON) and blocking (OFF) of current can be used as the switching element in the present embodiment. For example, an IGBT (Insulated Gate Bipolar Transistor), a power MOSFET (Metal Oxide Semiconductor Field Effect Transistor) and the like can be used.

The inverter 153 shown in FIG. 3 is constituted by legs 253 (253U, 253V, 253W) each comprised of a plurality of semiconductor elements, and both ends of the leg 253 are connected to a capacitor 301. An upper side arm of the leg 253U is constituted by a switching element 204UH and a diode element 205UH for return current. Also, a lower side arm of the leg 253U is constituted by a switching element 204UL and a diode element 205UL for return current. In the same manner, an upper side arm of the leg 253V is constituted by a switching element 204VH and a diode element 205VH for return current. Also, a lower side arm of the leg 253V is constituted by a switching element 204VL and a diode element 205VL for return current. Moreover, an upper side arm of the leg 253W is constituted by a switching element 204WH and a diode element 205WH for return current. Also, a lower side arm of the leg 253W is constituted by a switching element 204WL and a diode element 205WL for return current. Switching signals to the switching elements 204UH, 204UL, 204VH, 204VL, 204WH and 204WL are controlled by an inverter gate controller 302 which is a subordinate controller.

The chopper 154 shown in FIG. 4 is constituted by one leg 253 (253X) comprised of a plurality of semiconductor elements, and both ends of the leg 253 are connected to a capacitor 401. An upper side arm of the leg 253X is constituted by a switching element 204XH and a diode element 205XH for return current. Also, a lower side arm of the leg 253X is constituted by a switching element 204XL and a diode element 205XL for return current. An interconnected point of the switching elements 204XH and 204XL is connected via a reactor 403 to the storage cell 106 (see FIG. 1). Switching signals to the switching elements 204XH and 204XL are controlled by a chopper gate controller 402 which is a subordinate controller.

By way of example of the control operation, description will be given of an example of the chopper gate controller 402.

Switching signals to be given to the chopper 154 are given through a step-up/down switching circuit (not shown). Selection of the switching signals depends on the magnitude relation between a DC voltage value appearing between the chopper 154 and the inverter 153, and an output voltage value of the converter 152 (rectifying function). More specifically, when the output of the chopper 154 is higher than the output voltage of the converter 152, a PWM (Pulse Width Modulation) signal is transmitted to the switching element 204XL, and in the reverse case, a PWM signal is transmitted to the switching element 204XH.

Where power is discharged from the storage cell 106, the switching element 204XL is allowed to switch between on and off in response to the PWM signal. When the switching element 204XL is turned on, energy is accumulated in the reactor 403. On the other hand, when the switching element 204XL is turned off, the voltage of the storage cell 106 and the energy in the reactor 403 cause a higher voltage than the voltage of the storage cell 106 to be charged into the capacitor 401 via the diode element 205XH which is connected across the switching element 204XH.

Where power is charged into the storage cell 106, the switching element 204XH is allowed to switch between on and off in response to the PWM signal. When the switching element 204XH is turned on, power accumulated in the capacitor 401 is charged into the storage cell 106 via the reactor 403. When the switching element 204XH is turned off, the energy accumulated in the reactor 403 is allowed to circulate via the diode element 205XL which is connected across the switching element 204XL. These operations enable power to be charged into and discharged from the storage cell 106.

Note that, although in a commonly-used power conversion device, capacitors are collectively arranged in some cases, the capacitors 201, 301 and 401 in the present embodiment are separately arranged from a standpoint of standardization of the configuration of a basic converter unit 960 (see FIG. 12) which will be described later. More specifically, the capacitors 201 and 301 are further separated for each leg 253.

Conduction and blocking of current by the switching elements 204 and the diode elements 205 of the legs 253 shown in FIGS. 2 to 4 are carried out to allow the converter 152 to perform AC to DC conversion and to allow the inverter 153 to perform DC to AC conversion. At the conduction, loss is generated in resistances included in the switching elements 204 and the diode elements 205. Moreover, loss is generated also in switching the state from conduction to blocking. Consequently, the operation of the power conversion device 150 is accompanied by heat generation.

<Configuration of Air-Cooled Double-Sided Cooling Power Unit>

Next, a double-sided cooling power module 600 (heating element, or a semiconductor device for the power conversion device) used in the present embodiment will be described with reference to an appearance view shown in FIG. 5A and a circuit diagram shown in FIG. 5B. In FIG. 5B, the double-sided cooling power module 600 includes switching elements 204MH, 204ML and diode elements 205MH, 205ML which are mounted on an insulator 753. Connection between the respective semiconductor elements is made so as to constitute the leg 253 (e.g., see FIG. 2). Moreover, attached to the insulator 753 are a P-terminal 754P (DC positive terminal), an N-terminal 754N (DC negative terminal), an AC-terminal 754AC (AC-terminal), and gate terminals 751 for controlling on and off of each switching element.

Figure 5A:
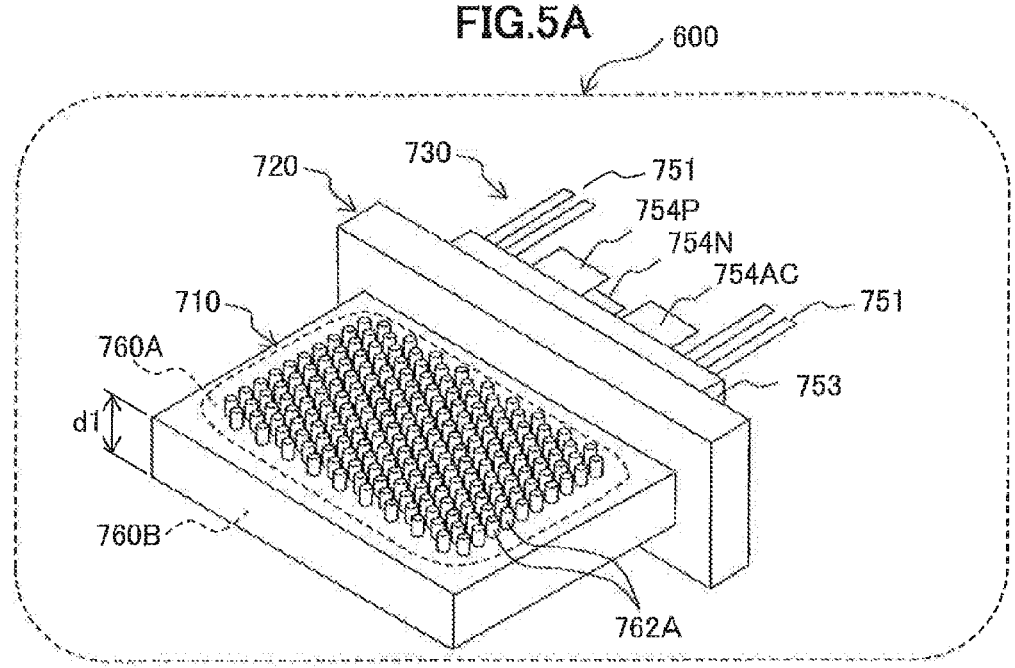
FIG. 5A is an appearance view of a double-sided cooling power module.
Figure 5B:
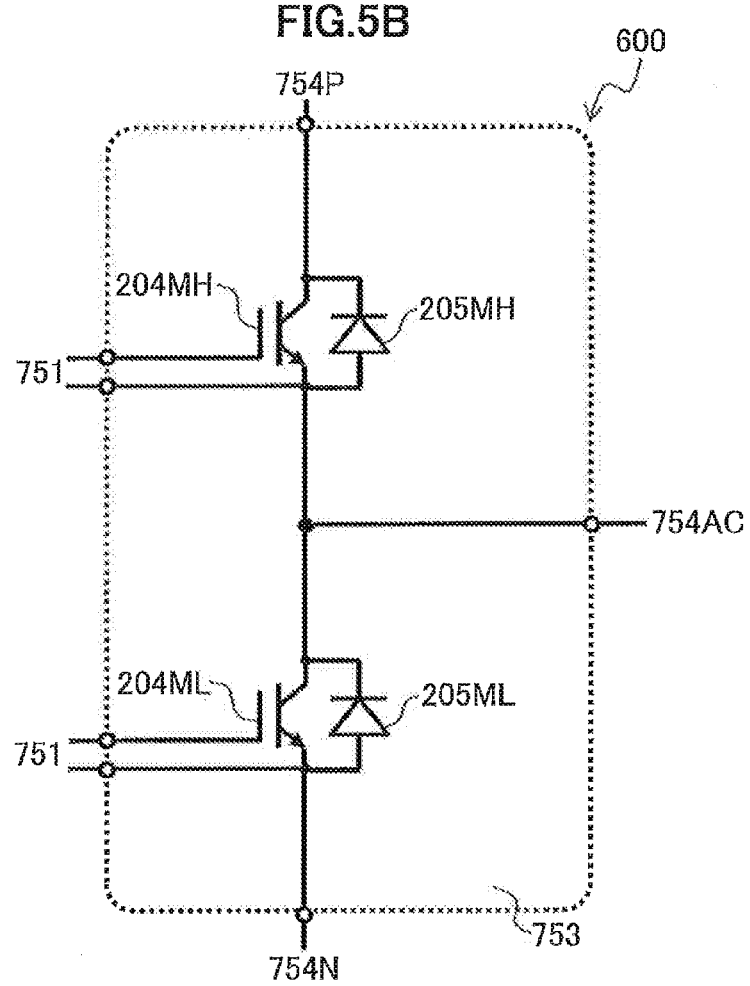
FIG. 5B is a circuit diagram of the power module.

Next, in FIG. 5A, the double-sided cooling power module 600 is constituted by a body part 710 which has the form of a nearly rectangular parallelepiped, a flange part 720 which has the form of a nearly rectangular parallelepiped and is formed to spread one side surface of the body part 710, and a terminal part 730 composed of a plurality of terminals which project from a surface opposite to the body part 710 on the flange part 720 and is composed of a plurality of terminals. The terminals constituting the terminal part 730 include the P-terminal 754P, the N-terminal 754N, the AC-terminal 754AC and the gate terminals 751 shown in FIG. 5B.

A number of (200 or more in total) pin fins 762A, each being a projection having the form of a minute column, are provided to project from one principal surface 760A of the body part 710. Also, the same number of pin fins 762B (not shown) as the pin fins 762A are formed on the other principal surface 760B opposite to the surface 760A of the body part 710. In the description below, the pin fins 762A, 762B are collectively referred to merely as "pin fins 762" in some cases. The double-sided cooling power module 600 has originally assumed water-cooled cooling and thus is adapted to immerse the body part 710 in a refrigerant basin with the terminal part 730 directed upward and the body part 710 directed downward and to allow refrigerant to pass between the pin fins 762. In view of this, the surface 760A, 760B is hereinafter referred to as a "cooling surface". A thickness of the body part 710 exclusive of each pin fin 762, namely a distance between the cooling surfaces 760A, 760B, is defined as d1.

When the semiconductor elements described above are operated, they exhaust heat by way of the cooling surfaces 760A, 760B while obtaining electric conduction with the outside by way of the terminal part 730. More specifically, since the terminal part 730 is formed on one side surface which abuts on the cooling surfaces 760A, 760B and thus is electrically isolated from the cooling surfaces 760A, 760B, the heat transport pathway and the electric pathway are independent of each other.

<Mechanical Configuration of Air-Cooled Double-Sided Cooling Power Unit>

Figure 6A:
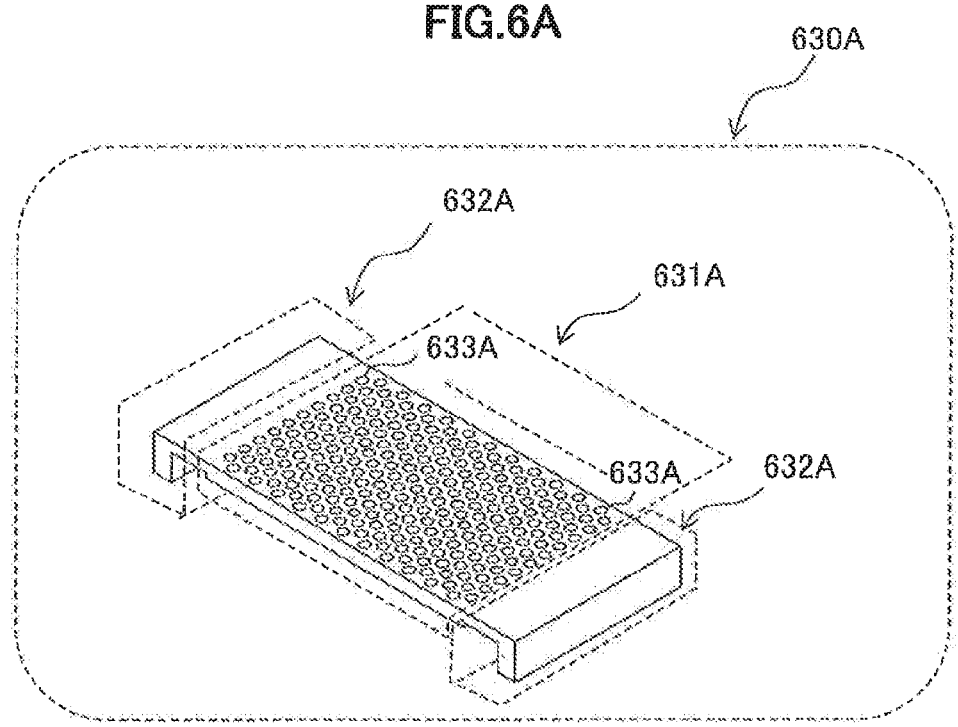
FIGS. 6A and 6B are perspective views of heat receiving spacers.
Figure 6B:
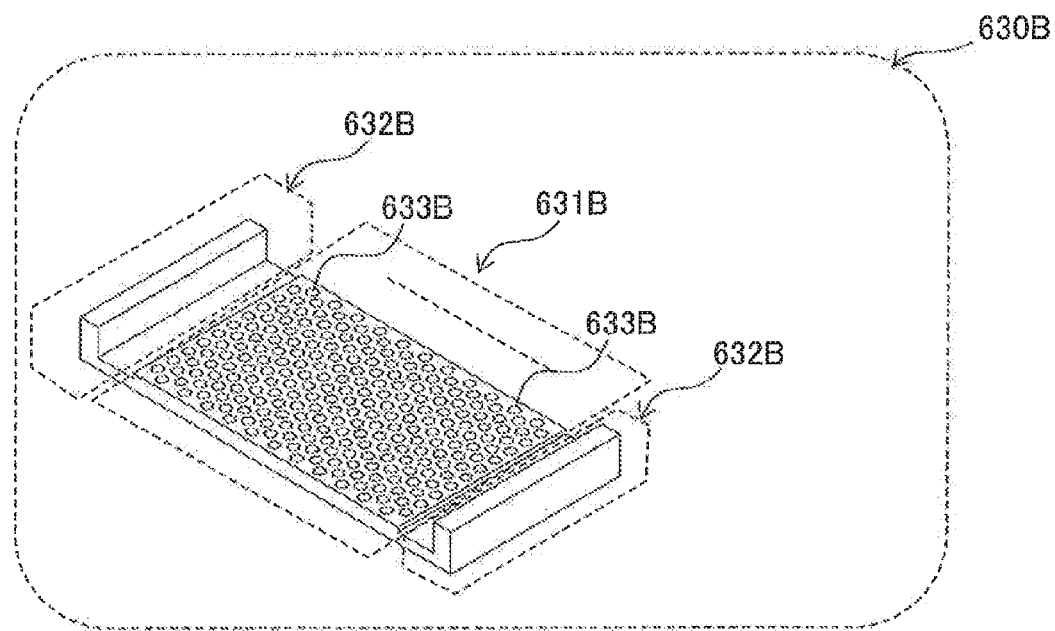

One pair of heat receiving spacers 630A, 630B shown in FIGS. 6A and 6B are allowed to come face-to-face with the cooling surfaces 760A, 760B of the double-sided cooling power module 600. The heat receiving spacer 630A is constituted by a heat receiving part 631A (heat receiving plate) having the form of a nearly rectangular plate and one pair of space securing parts 632A each having the form of a nearly rectangular parallelepiped and projecting from both ends of the heat receiving part 631A toward the heat receiving spacer 630B. Also, a number of columnar through-holes 633A (holes) are formed in the heat receiving part 631A. These through-holes 633A are formed at positions on the heat receiving part 631A which face each pin fin 762A on the cooling surface 760A, and have a slightly greater diameter than a diameter of each pin fin 762A. It is normally desirable to allow the pin fin 762A to fit into the through-hole 633A without any space, but since the diameter and/or position of the pin fin 762A involve a slight manufacturing error, the diameter of the through-hole 633A is enlarged to such an extent that the manufacturing error can be absorbed.

Moreover, the heat receiving spacer 630B is constituted by a heat receiving part 631B having the form of a nearly rectangular plate and one pair of space securing parts 632B each having the form of a nearly rectangular parallelepiped and projecting from both ends of the heat receiving part 631B toward the heat receiving spacer 630A. The heat receiving spacer 630B has a vertically symmetrical shape as a whole to the heat receiving spacer 630A, and through-holes 633B are formed in the heat receiving part 631B, at positions which face each pin fin 762B projecting from the cooling surface 760B of the double-sided cooling power module 600.

Figure 7:
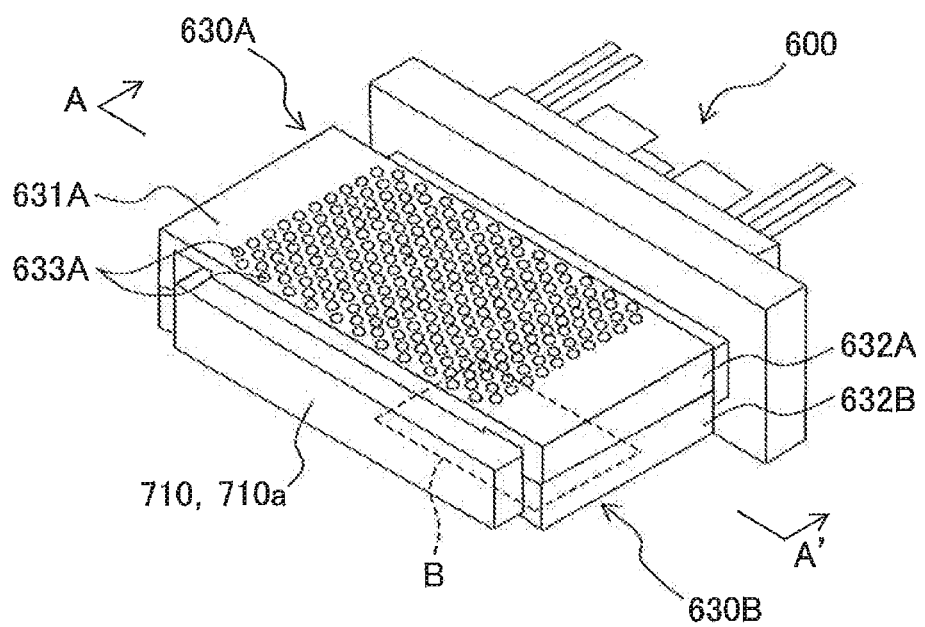
FIG. 7 is a perspective view showing a state in which the heat receiving spacers are attached to the power module.

When attaching the heat receiving spacers 630A, 630B to the double-sided cooling power module 600, heat conducting grease is sufficiently coated on the cooling surfaces 760A, 760B and the space securing parts 632A, 632B are then allowed to come face-to-face with each other while aligning the positions of the through-holes 633A, 633B with each pin fin 762. FIG. 7 shows a state in which the heat receiving spacers 630A, 630B are thus attached to the double-sided cooling power module 600. As shown in FIG. 7, an end face 710a of the body part 710 is exposed to the outside, but the cooling surfaces 760A, 760B are mostly covered by the heat receiving spacers 630A, 630B.

Figure 8:
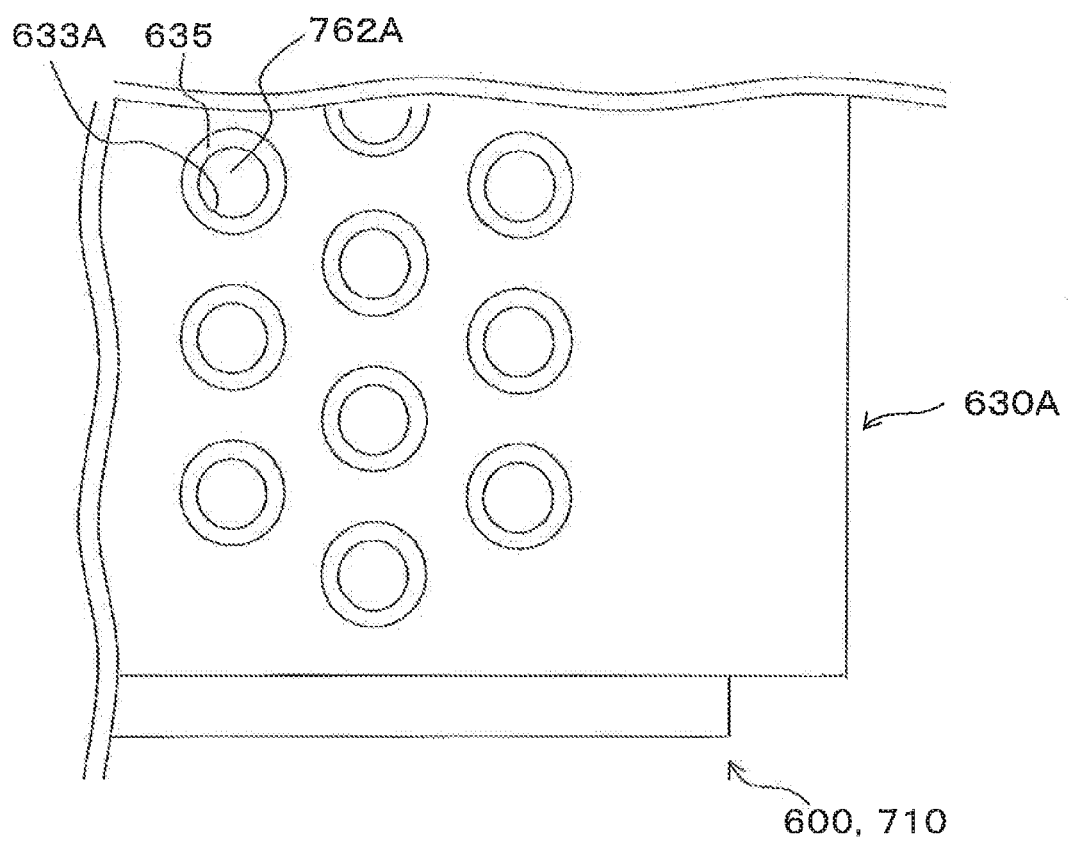
FIG. 8 is an enlarged view of a portion B in FIG. 7.

FIG. 8 shows an enlarged plan view of a portion B surrounded by a dashed line in FIG. 7.

As described above, since the diameter of each through-hole 633A is slightly greater than the diameter of each pin fin 762A, each pin fin 762A is movably inserted into a gap 635 while securing the gap 635 between each pin fin 762A and each through-hole 633A. In the event of insertion, the heat conducting grease coated on each pin fin 762A penetrates to be pushed into the gap 635 and thus the gap 635 is filled with the heat conducting grease without any space.

Figure 9:
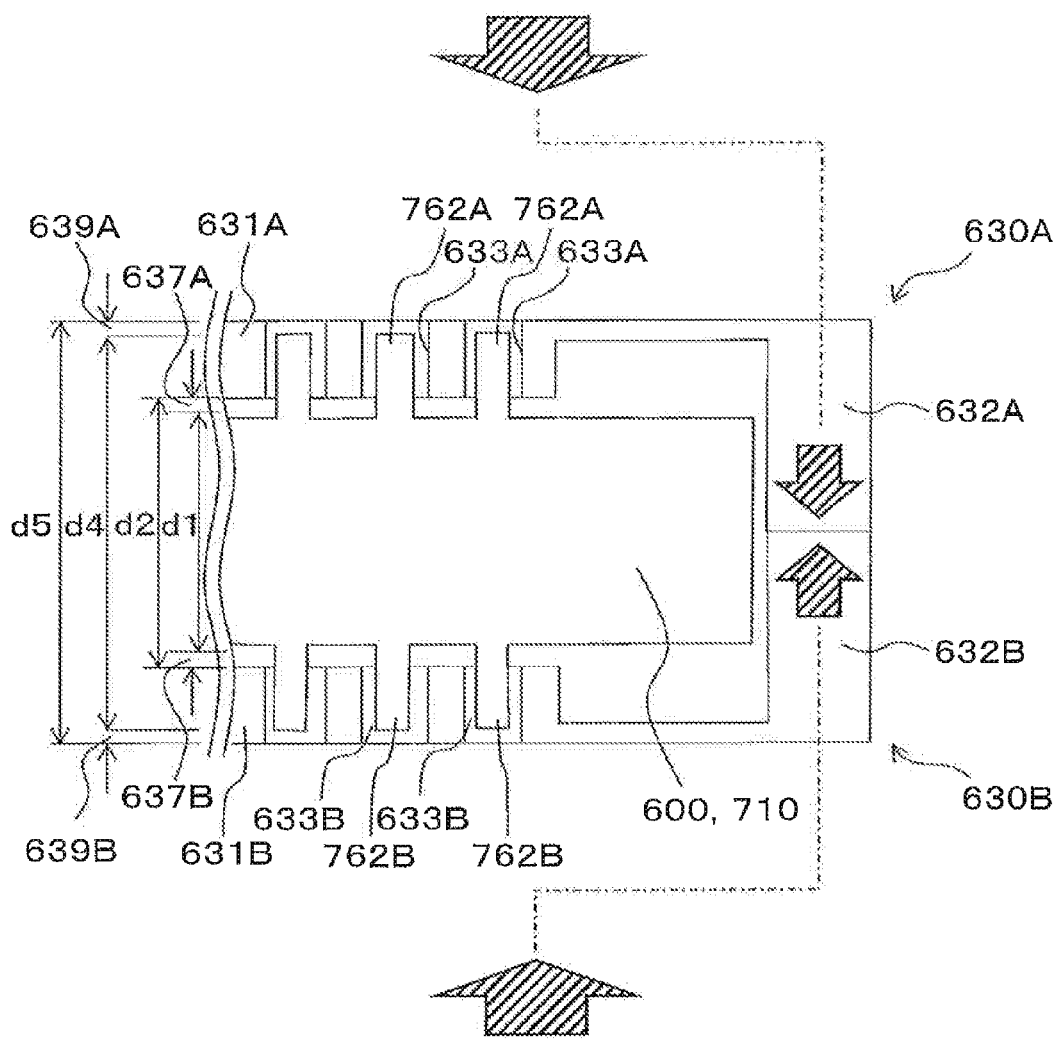
FIG. 9 is a cross-sectional, view taken along a line A-A' in FIG. 7.

Next, FIG. 9 shows an enlarged view of a major part (end portion) on the cross-section surface along a line A-A' in FIG. 7. When the space securing parts 632A, 632B are allowed to come face-to-face with each other, the heat receiving parts 631A, 631B face each other at a predetermined distance. This distance is defined as d2. The heat receiving spacers 630A, 630B are formed to allow the distance d2 to be slightly greater than the thickness d1 of the body part 710 of the double-sided cooling power module 600. As a result, gaps 637A, 637B are formed between the heat receiving part 631A and the body part 710, and between the heat receiving part 631b and the body part 710, respectively. Since the double-sided cooling power module 600 has looseness for the heat receiving spacers 630A, 630B, widths of the gaps 637A, 637B are not necessarily equal to each other.

When the space securing parts 632A, 632B are allowed to come face-to-face with each other, the heat conducting grease coated on each pin fin 762 also penetrates to be pushed into the gaps 637A, 637B and thus the gaps 637A, 637B are also filled with the heat conducting grease without any space. Also, when a thickness of the body part 710 inclusive of a distance from a tip of the pin fin 762A to a tip of the pin fin 762B is defined as d4 and the entire width obtained when the heat receiving spacers 630A, 630B are allowed to come face-to-face with each other is defined as d5, the heat receiving spacers 630A, 630B are formed to allow the width d5 to be slightly greater than the thickness d4. Consequently, gaps 639A, 639B are formed between an upper surface of the heat receiving spacer 630A in the illustration and the tip of the pin fin 762A, and between a lower surface of the heat receiving spacer 630B and the tip of the pin fin 762B, respectively. As described above, since the double-sided cooling power module 600 has looseness for the heat receiving spacers 630A, 630B, widths of the gaps 639A, 639B are not necessarily equal to each other.

When the heat receiving spacers 630A, 630B are attached to a cooler 610 (details will be described later), a pressing force such as indicated by hatched arrows is applied to the heat receiving spacers. This pressing force is applied to the portions at which the space securing parts 632A, 632B are allowed to come face-to-face with each other. In the present embodiment, since the gaps 637A, 637B are formed between the body part 710 and the heat receiving spacers 630A, 630B and further the gaps 639A, 639B are formed between each tip of the pin fins 762A, 762B and the heat receiving spacers 630A, 630B, application of the above pressing force to the body part 710 can be prevented, thereby making it possible to prevent breakage of the double-sided cooling power module 600 before something happens.

Figure 10:
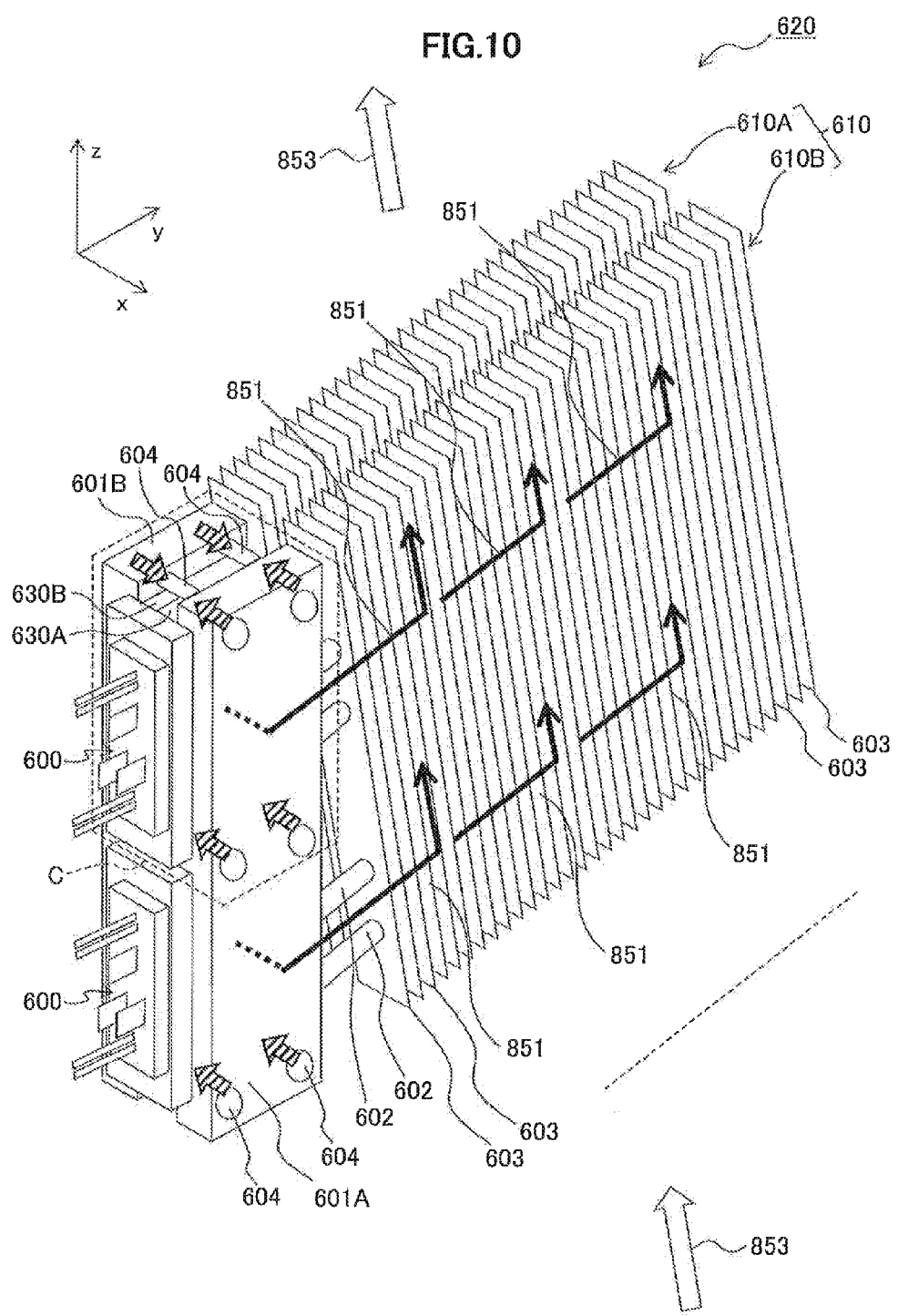
FIG. 10 is a perspective view of an air-cooled double-sided cooling power unit.

Next, FIG. 10 shows a perspective view of a state in which two double-sided cooling power modules 600 are installed on the cooler 610. The cooler 610 is constituted by a pair of coolers 610A, 610B. The coolers 610A, 610B have heat receiving blocks 601A, 601B each of which is in the form of a nearly rectangular parallelepiped block, and the heat receiving blocks 601A, 601B sandwich therebetween, the two double-sided cooling power modules 600 on each of which the heat receiving spacers 630A, 630B are installed.

The heat receiving blocks 601A, 601B are secured by a plurality of securing members 604 to each other and thus pressing force is applied to the heat receiving blocks 601A, 601B in directions indicated by hatched arrows. Note that, as described above with respect to FIG. 9, the pressing force is applied to the heat receiving spacers 630A, 630B, but not applied to the double-sided cooling power modules 600. As for the securing member 604, a general bolt and a nut can be used.

In FIG. 10, four heat pipes 602 project from the heat receiving block 601A in the y-axis direction, with an inclination of about 10 degrees to the x-y plane (horizontal plane) formed by the x-axis and the y-axis. Also, a plurality of plate-like heat dissipating fins 603 are attached by welding to the heat pipes 602 in a radial direction of the heat pipes 602. Accordingly, each of the heat dissipating fins 603 is inclined at about 10 degrees to the x-z plane (vertical plane) formed by the x-axis and the z-axis. The cooler 610B is also configured in the same manner as the cooler 610A. As described above, the two double-sided cooling power modules 600 are installed on the cooler 610, thereby constituting one air-cooled double-sided cooling power unit 620.

When the double-sided cooling power modules 600 generate heat, the heat is propagated via the heat receiving spacers 630A, 630B to the heat receiving blocks 601A, 601B and further propagated via the heat pipes 602 backward (in the y-axis direction). Then, when cooling wind 853 directed upward from bottom (directed in the z-axis direction) is fed to the air-cooled double-sided cooling power unit 620, the cooling wind 853 goes through the heat dissipating fins 603 toward the upper direction while cooling the fins 603, and thus the heat is rapidly emitted to the outside. Such heat propagation pathways are indicated by arrows 851 in the illustration. Note that heat propagation in a direction perpendicular to the cooling wind 853 is propagation caused mainly by the heat pipes 602.

Figure 11:
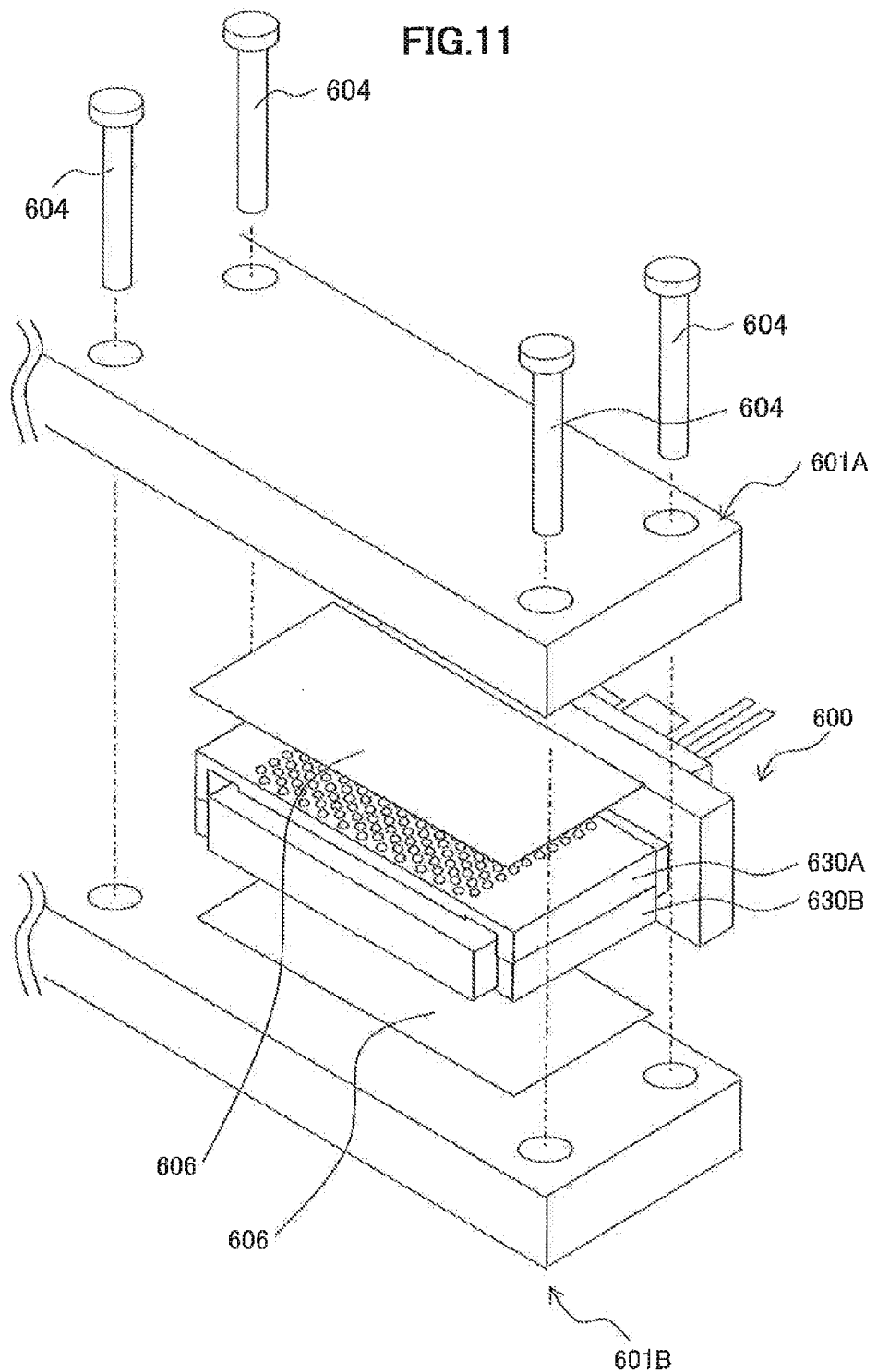
FIG. 11 is an exploded view of a portion C in FIG. 10.

FIG. 11 shows an exploded view of a portion C surrounded by a dashed line in FIG. 10.

In FIG. 11, heat conducting grease 606 is provided between the heat receiving spacer 630A and the heat receiving block 601A, and between the heat receiving spacer 630B and the heat receiving block 601B, respectively. When the heat receiving blocks 601A, 601B are secured by the securing members 604 to each other, the heat conducting grease 606 spreads along and over opposed surfaces of the heat receiving spacer 630A and the heat receiving block 601A, and opposed surfaces of the heat receiving spacer 630B and the heat receiving block 601B, to become the form of a thin film layer as shown in the figure. In the process, the heat conducting grease 606 penetrates into the gaps 639A, 639B (see FIG. 9) on the tips of each pin fin 762A, 762B and thus the heat conducting grease 606 spreads over outsides of each pin fin 762A, 762B without any space.

<Configuration of Basic Converter Unit>

Figure 12:
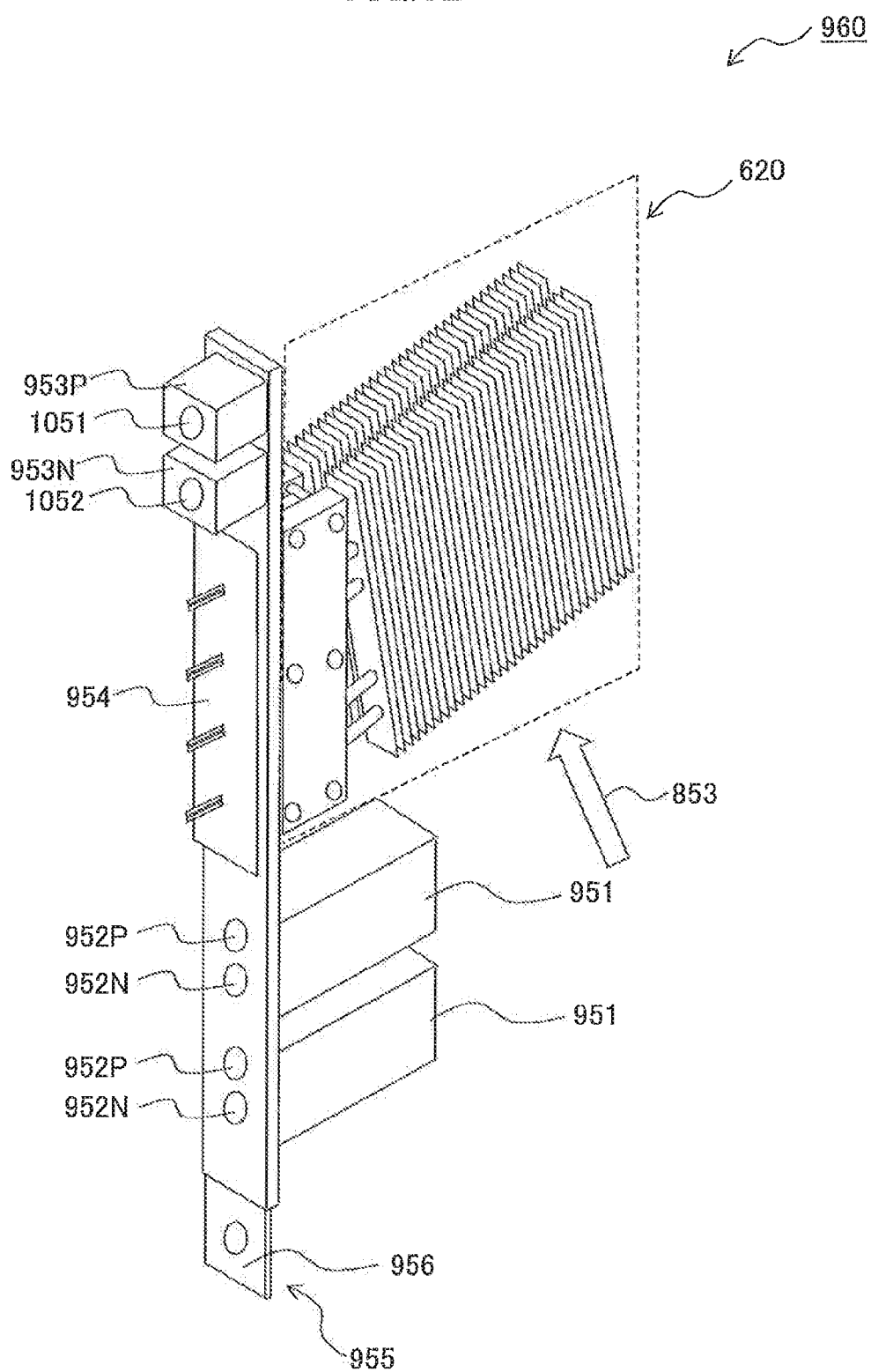
FIG. 12 is a perspective view of a basic converter unit.
Figure 13:
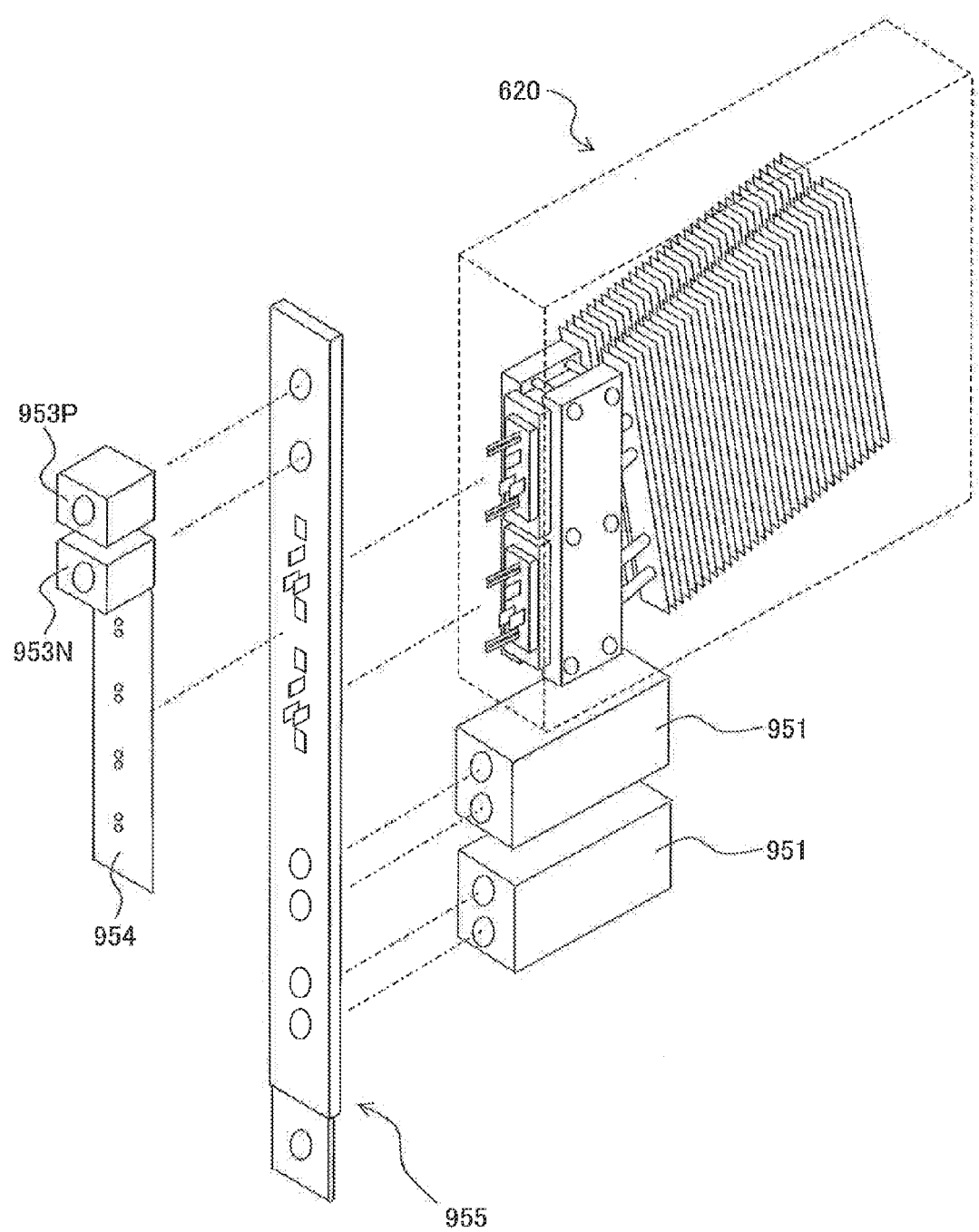
FIG. 13 is an exploded view of the basic converter unit.
Figure 14:
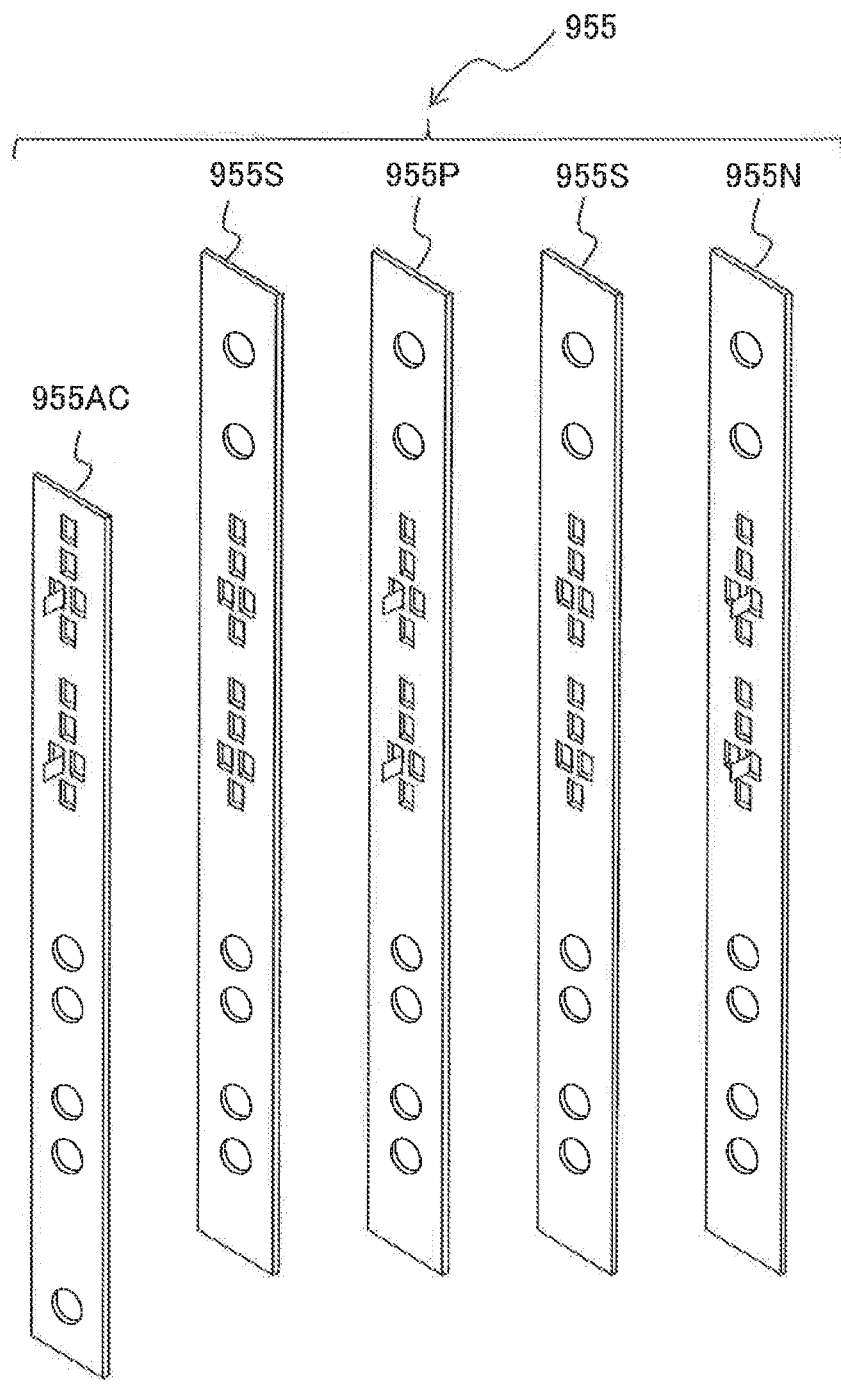
FIG. 14 is an exploded view of a laminate bus bar.
Figure 15:
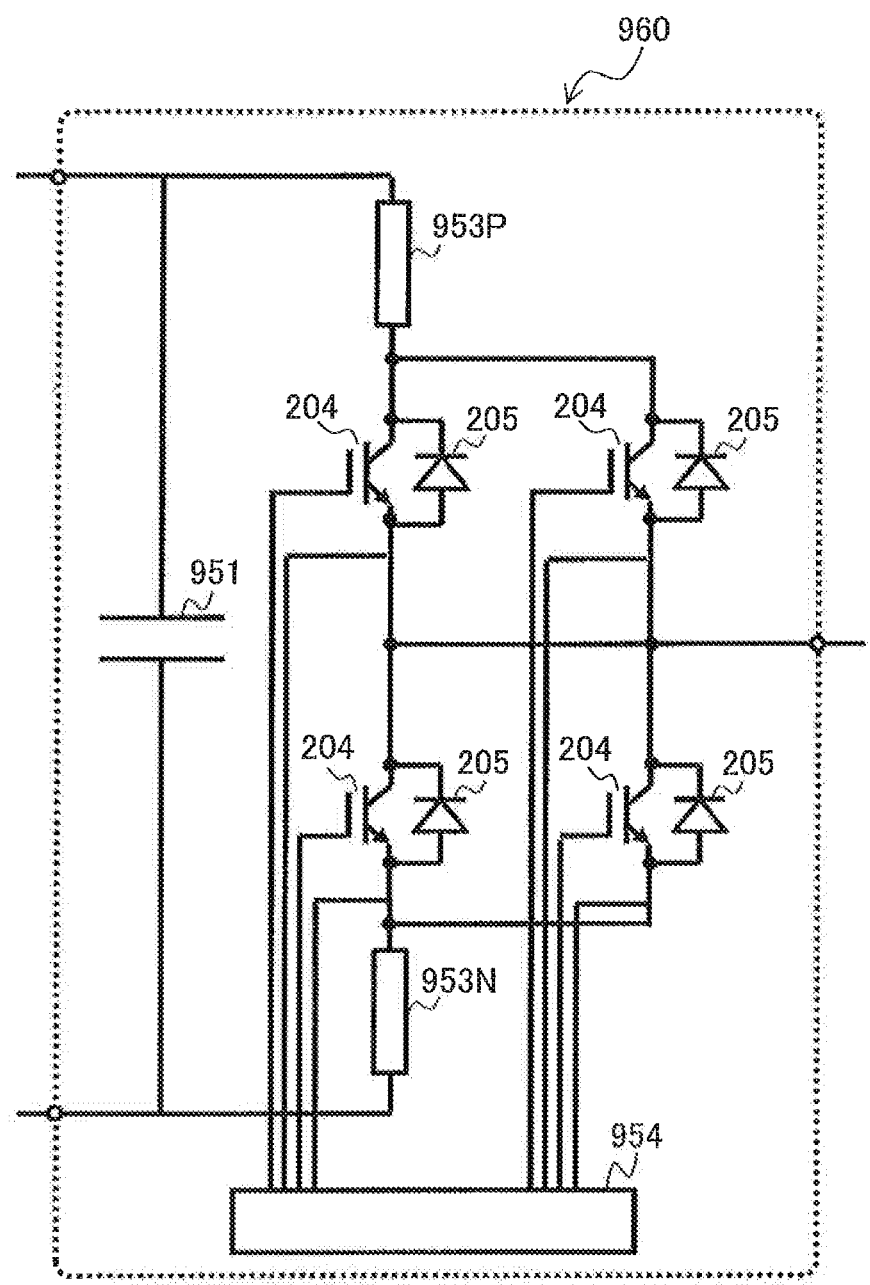
FIG. 15 is a circuit diagram of the basic converter unit.

Next, the basic converter unit 960 in the present embodiment will be described with reference to FIG. 12 to FIG. 15. FIG. 12 is a perspective view of the basic converter unit 960; FIG. 13 is an exploded view of the basic converter unit 960; FIG. 14 is an exploded view of a P-N-AC-layer laminate bus bar 955; and FIG. 15 is a circuit diagram of the basic converter unit 960.

In the basic converter unit 960 shown in FIG. 12, the P-terminal 754P (see FIGS. 5A, 5B), the N-terminal 754N and the AC-terminal 754AC of electric terminals in the air-cooled double-sided cooling power unit 620 described above are connected to the P-layer, the N-layer and the AC-layer of the P-N-AC-layer laminate bus bar 955, respectively. Moreover, the gate terminals 751 of the electric terminals are connected to a gate driver substrate 954. Also, each positive terminal 952P and each negative terminal 952N of a plurality of capacitors 951 are connected to the P-layer and the N-layer of the P-N-AC-layer laminate bus bar 955, respectively. Furthermore, a positive fuse 953P and a negative fuse 953N are connected to the P-layer and the N-layer of the P-N-AC-layer laminate bus bar 955, respectively. Note that the positive fuse 953P and the negative fuse 953N shown herein have a function of breaking circuits so as to protect the device when current of a specified level or more flows through the circuits, and thus if such a protective function is not required, the fuses can also be omitted.

FIG. 13 is an exploded view for FIG. 12. FIG. 14 is an exploded view of the P-N-AC-layer laminate bus bar 955. As shown in FIG. 14, the bus bar 955 is constituted by a P-layer bus bar 955P, an N-layer bus bar 955N and an AC-layer bus bar 955AC, and the bus bars are insulated by an insulating layer 955S from one another. Moreover, in the basic converter unit 960, the P-terminal 754P, the N-terminal 754N and the AC-terminal 754AC of the double-sided cooling power module are connected to the P-layer bus bar 955P, the N-layer bus bar 955N and the AC-layer bus bar 955AC, respectively. Also, each P-terminal and each N-terminal of the capacitors 951 are connected to the P-layer bus bar 955P and the N-layer bus bar 955N, respectively. An electric circuit diagram for the above configuration is shown in FIG. 15.

<Appearance Configuration of Power Conversion Device>

Figure 16:
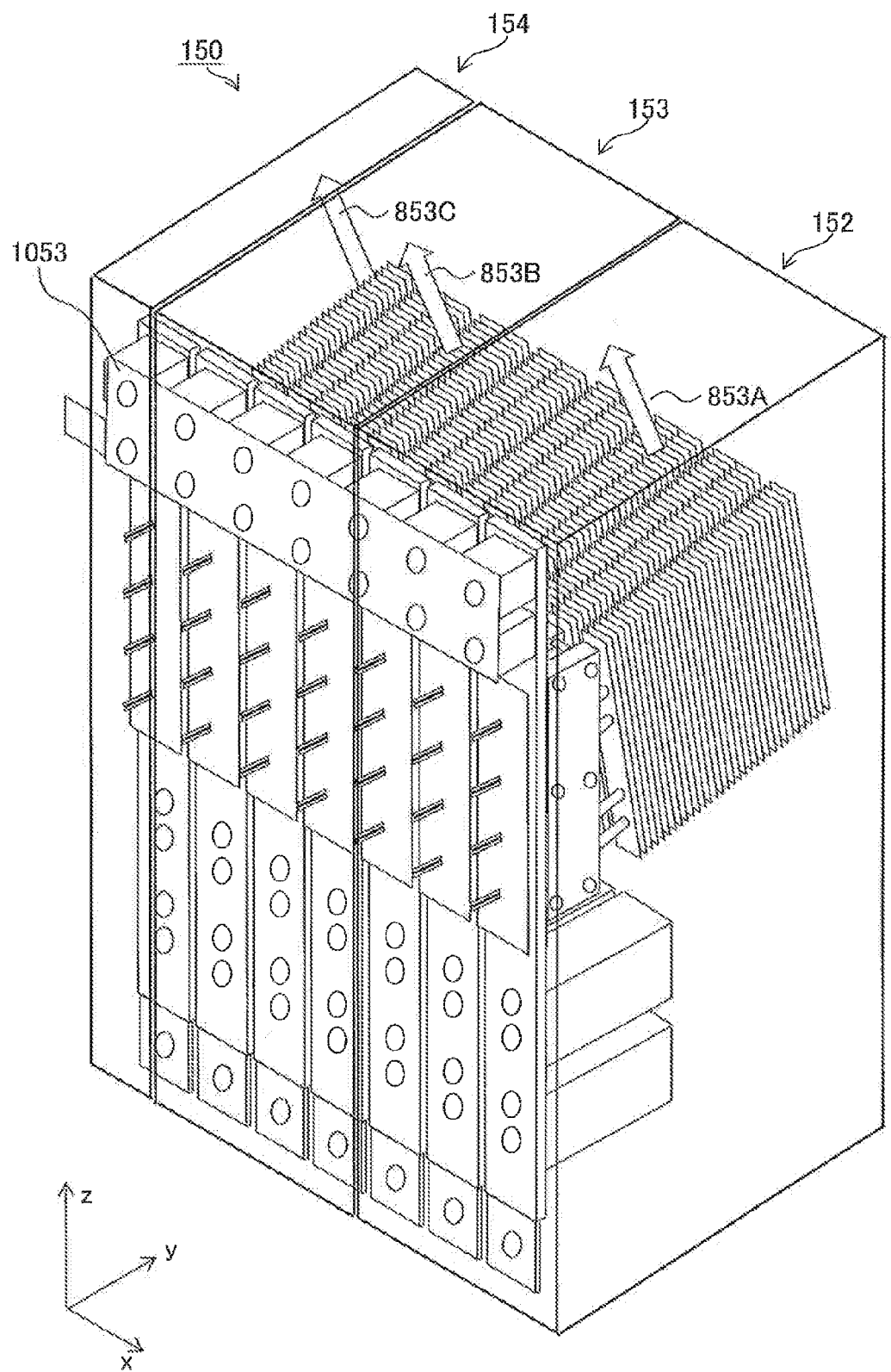
FIG. 16 is an appearance view of a power conversion device in which two or more basic converter units are installed.

FIG. 16 is an appearance view of the power conversion device 150 in which two or more basic converter units 960 are installed.

In the power conversion device 150, the converter 152, the inverter 153 and the chopper 154 are arranged side by side in this order. The converter 152 is constituted by the basic converter units 960 which correspond to three legs 253R, 253S and 253T shown in FIG. 2. The inverter 153 is constituted by the basic converter units 960 which correspond to three legs 253U, 253V and 253W shown in FIG. 3. The chopper 154 is constituted by one basic converter unit 960. Note that the converter 152, the inverter 153 and the chopper 154 may be arranged in a different order from that in the present embodiment, and the legs in each of the converter 152, the inverter 153 and the chopper 154 may be arranged in a different order of phases.

As described above with respect to FIG. 10, the air-cooled double-sided cooling power unit 620 in the present embodiment allows the heat generated by the double-sided cooling power modules 600 to be propagated via the heat pipes 602 backward (in the y-direction) to be emitted via the heat dissipating fins 603 provided backward to the outside. According to the configuration shown in FIG. 16, convenience of maintenance can be increased because multiple basic converter units 960 each attaching the air-cooled double-sided cooling power unit 620 thereon are laterally arranged. When any of the basic converter units 960 fails to operate properly, the failed unit is generally pull out from the power conversion device 150 and a spare unit is instead inserted into the power conversion device 150. In the process, pulling out the failed unit and inserting the spare unit can be realized by simply moving the respective units in the y-direction, and thus the failure can be rapidly coped with.

Figure 17:
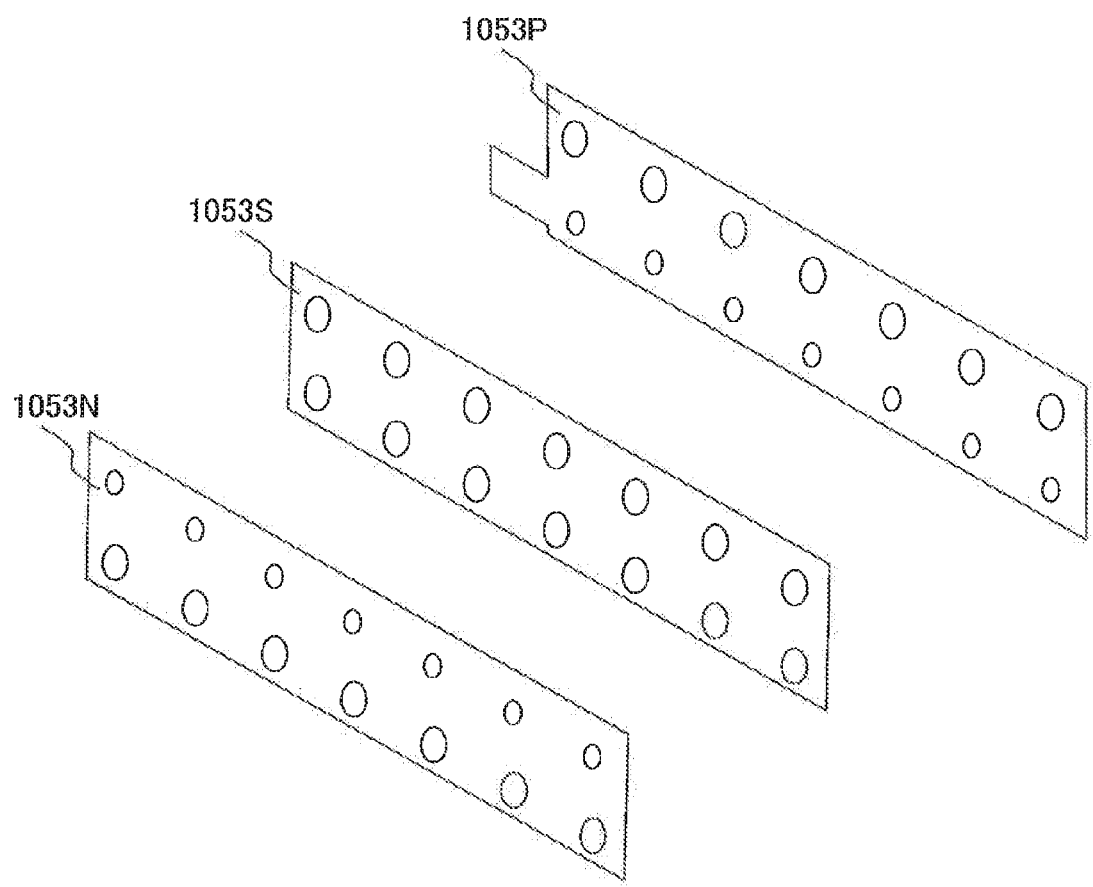
FIG. 17 is an exploded view of a phase-to-phase laminate bus bar.

The converter 152 is constituted so as to connect a P-N-layer phase-to-phase laminate bus bar 1053 to positive terminals 1051 and negative terminals 1052, respectively, of three basic converter units 960. The inverter 153 is also constituted in the same manner as the converter 152. The chopper 154 is constituted by one basic converter unit 960 and thus is not necessarily connected to the P-N-layer phase-to-phase laminate bus bar 1053. Note that, in the present embodiment in which the capacitance of the chopper 154 is increased, and the converter 152, the inverter 153 and the chopper 154 are unified as one system, it is desirable to connect the chopper 154 together with the converter 152 and the inverter 153 to the P-N-layer phase-to-phase laminate bus bar 1053. Herein, as shown in FIG. 17, the P-N-layer phase-to-phase laminate bus bar 1053 includes a phase-to-phase P-bus bar 1053P and a phase-to-phase N-bus bar 1053N, and the bus bars are insulated by an insulating layer 1053S from each other.

In the converter 152, the inverter 153 and the chopper 154 which are provided with the above configurations, a plurality of basic converter units 960 can also be connected in parallel with each other for one leg. This makes it possible to increase the rated output capacity of the power conversion device.

In a cooling method for the basic converter units 960 in the power conversion device shown in FIG. 16, in the same manner as in FIG. 10, the cooling wind 853 is fed to the heat dissipating fins 603 upward from bottom. Accordingly, even if the basic converter units 960 are densely installed side by side in the power conversion device 150, an advantage of not decreasing a cooling effect of each basic converter unit 960 can be obtained. Also, where temperatures of the respective semiconductor elements in the converter 152, the inverter 153 and the chopper 154 are different from each other, wind speeds of cooling winds 853A, 853B, 853C or the like may be changed.

Advantageous Effects of Embodiments

As described above, the cooling structure according to the present embodiment includes: a heating element (600) having at least one cooling surface (760A, 760B) from which a plurality of pin fins (762) project; a heat receiving plate (631A, 631B) which has a shape complying with the cooling surface (760, 760B) and in which holes (633A, 633B) are formed at positions facing each pin fin (762), each pin fin (762) being movably inserted into the holes; a cooler (610) which has a pair of clamping members (601A, 601B) that sandwich therebetween the heating element (600) and the heat receiving plate (631A, 631B) while pressing the heating element and the heat receiving plate, and which cools the heat receiving plate (631A, 631B); and a space securing part (632A, 632B) which is provided on the heat receiving plate (631A, 631B) and suppresses a distance between the pair of clamping members (601A, 601B) so as not to apply a pressing force by the clamping members (601A, 601B) to the heating element (600).

This allows the cooling structure according to the present embodiment to make it possible to propagate heat of the heating element (600) via the heat receiving plate (631A, 631B) and the clamping members (601A, 601B) for cooling the heating element.

Also, in the present embodiment, the heating element (600) has the cooling surface (760A, 760B) on two opposite surfaces thereof, and the heat receiving plate (631A, 631B) has a shape complying with the cooling surface (760A, 760B) on the two surfaces, the holes (633A, 633B) being formed at the positions facing each of the pin fins (762) which project from the cooling surface (760A, 760B) on the two surfaces. This makes it possible to propagate heat from the cooling surface on the two surfaces and to further enhance a heat conduction effect.

Moreover, in the present embodiment, since a heat conducting agent (606) is provided between the pin fins (762) and the heat receiving plate (631A, 631B), thermal resistance between the heating element (600) and the heat receiving plate (631A, 631B) can be reduced to downsize the cooler (610).

Furthermore, in the present embodiment, the distance (d5+the thickness of the heat conducting grease 606) between the pair of clamping members (601A, 601B) suppressed by the space securing part (632A, 632B) is greater than the thickness (d4) of the heating element (600) inclusive of the pin fins (762). Consequently, when the heating element (600), the heat receiving plate (631A, 631B) and the space securing part (632A, 632B) are clamped by the clamping members (601A, 601B), application of a pressing force to each pin fin (762) can be prevented to prevent breakage of the heating element (600).

In addition, in the power conversion device 150 according to the present embodiment, the side surfaces (terminal part 730) on which the plurality of semiconductor devices (600) for the power conversion device have the electric terminals are arranged on the same plane, and cooling wind is fed by a blower (101) to the plurality of heat dissipating fins (603) from the reverse side of the same plane. Accordingly, wiring between the semiconductor devices (600) for the power conversion device can be easily realized by the P-N-layer phase-to-phase laminate bus bar 1053.

Modified Examples

The present invention is not limited to the above embodiments, and can be variously modified, for example, as follows.

Figure 18:
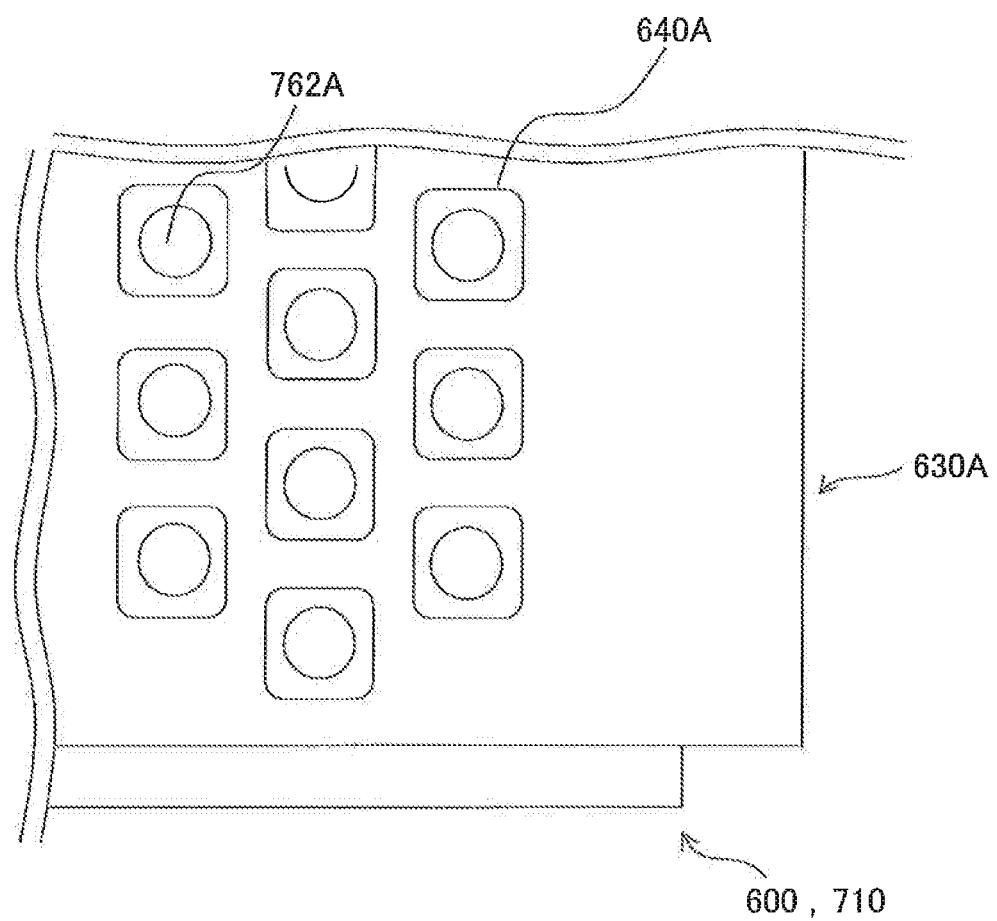
FIG. 18 is a view corresponding to the enlarged view of the portion B, in one modified example of the heat receiving spacer.

(1) Through-holes to be formed in the heat receiving spacers 630A, 630B are not limited to ones in the embodiments, and can be changed to ones having various shapes and sizes as long as they are, in short, through-holes to allow the pin fins 762 to be movably inserted thereinto. For example, as shown in FIG. 18, rectangular through-holes 640A may be formed at positions corresponding to each pin fin 762A, in the heat receiving spacers 630A. In this case, even if a length of one side of the rectangular through-hole 640A is the same as the diameter of the circular through-hole 633A (see FIG. 8) in the above embodiments, an area of the through-hole 640A can be increased resulting in an advantage of further facilitating work to attach the heat receiving spacer 630A to the double-sided cooling power module 600.

Figure 19:
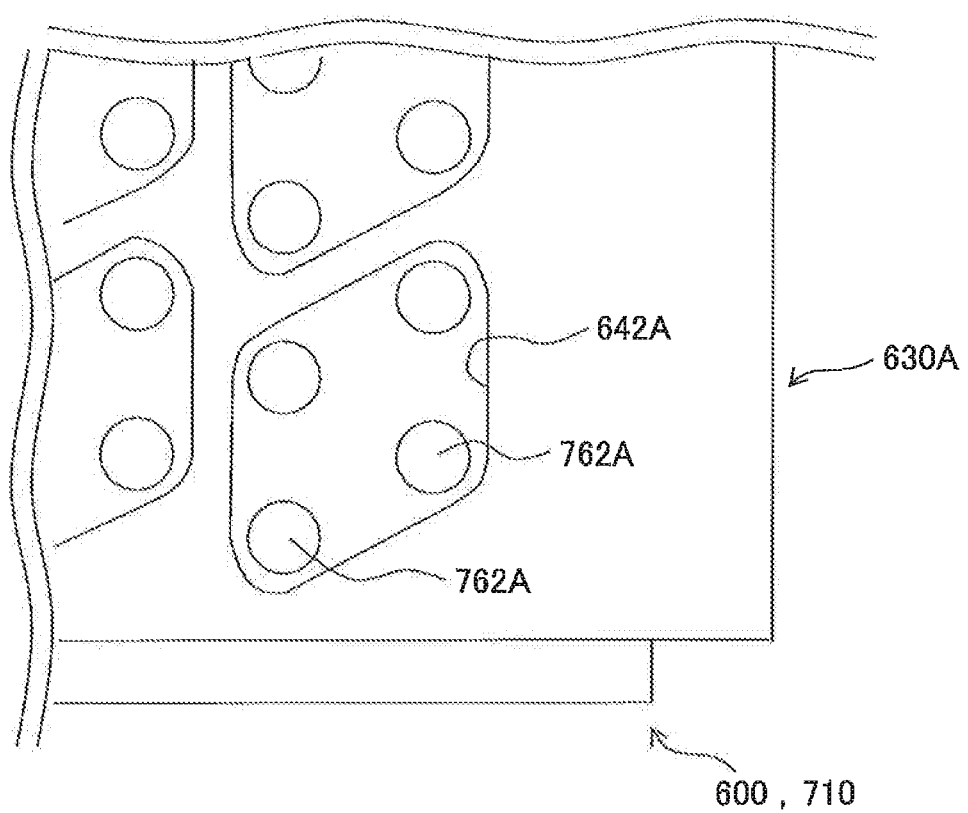
FIG. 19 is a view corresponding to the enlarged view of the portion B, in another modified example of the heat receiving spacer.

(2) Moreover, each of through-holes to be formed in the heat receiving spacers 630A, 630B is not limited to one into which one pin fin 762 is movably inserted. For example, as shown in FIG. 19, a through-hole 642A into which four pin fins 762 are movably inserted may be formed. Thus, when the through-hole 642A is formed to allow a plurality of pin fins 762 to be movably inserted thereinto, the number of through-holes to be formed can be reduced resulting in advantages of being able to loosen the dimensional precision and reduce the manufacturing process. Note that although in the example of FIG. 19, four pin fins 762 are movably inserted into one through-hole 642A which, has the form of a nearly parallelogram, the number of the pin fins 762 to be movably inserted into the one through-hole may be two, three, or five or more. Moreover, with this modification, the shape of each through-hole may be a shape other than the nearly parallelogram.

Figure 20:
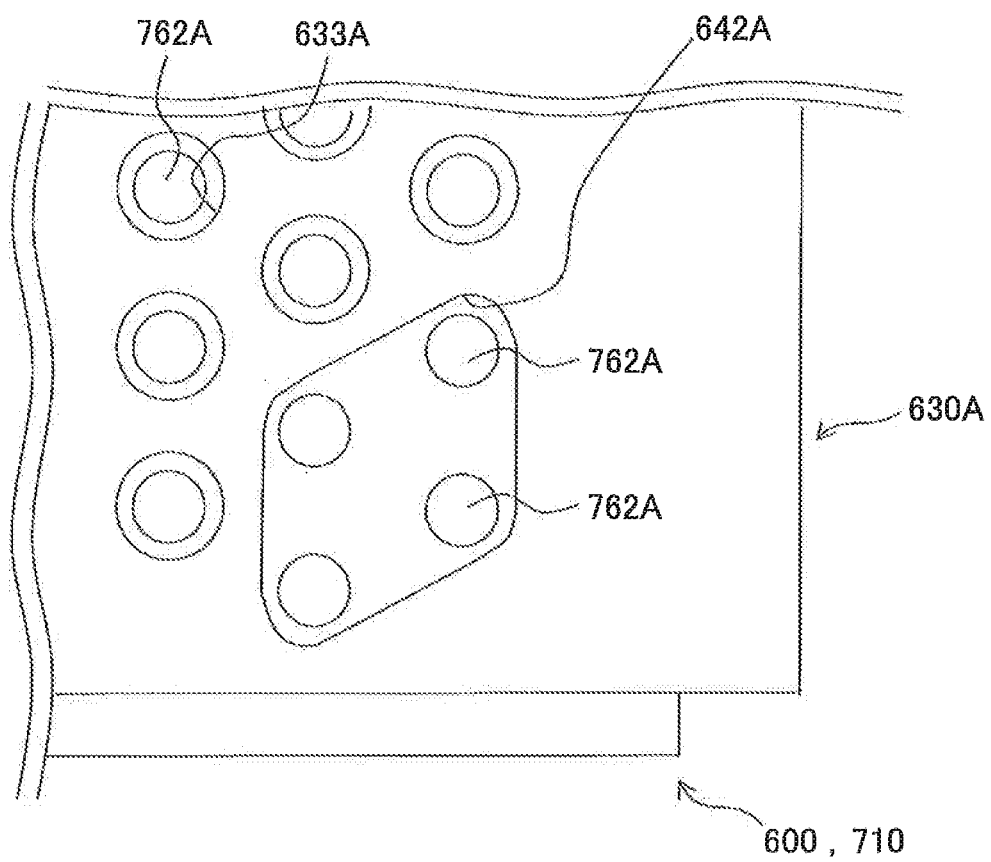
FIG. 20 is a view corresponding to the enlarged view of the portion B, in still another modified example of the heat receiving spacer.

(3) Further, the shape of each of through-holes to be formed in the heat receiving spacers 630A, 630B, and the number of the pin fins 762 to be movably inserted into the through-holes, may be changed for every region on the heat receiving spacers 630A, 630B. For example, as shown in FIG. 20, the through-hole 642A into which four pin fins 762 are movably inserted, and the through-hole 633A into which one pin fin 762 is movably inserted, may be formed in the heat receiving spacer 630A. The former through-hole 642A has an advantage over the through-hole 633A in that the manufacturing process can be reduced, while the latter through-hole 633A has an advantage over the through-hole 642A in that the thermal resistance can be less reduced. In view of this, it is desirable for a region having less heat discharge in the double-sided cooling power module 600 to adopt the through-hole 642A into which a plurality of pin fins 762 are movably inserted, and for a region having more heat discharge to adopt the through-hole 633A into which a single pin fin 762 is movably inserted. This makes it possible to balance ease of manufacturing with thermal performance.

(4) Although in the above embodiments, the heat receiving spacers 630A, 630B and the coolers 610A, 610B are separate members, heat receiving spacers and coolers may be configured integral with each other. For example, the heat receiving blocks 601A, 601B and the heat receiving spacers 630A, 630B shown in FIG. 11 may be replaced with heat receiving blocks 650A, 650B shown in FIG. 21. The heat receiving block 650B is provided with a plurality of columnar depressed portions 654B which are formed at places facing the pin fins 762 of the double-sided cooling power module 600. In the same manner, the heat receiving block 650A is also provided with a plurality of columnar depressed portions (not shown) which are formed at places facing the pin fins 762.

Moreover, on the heat receiving block 650B, a pair of space securing parts 652 each being in the form of a nearly rectangular parallelepiped is formed to surround a region in which the depressed portions 654B are formed. Note that in this modified example, what are equivalent to the space securing parts 652 are not formed at the corresponding places on the heat receiving block 650A. Each of the space securing parts 652 is set to be smaller than the thickness d4 (see FIG. 9) of the body part 710 inclusive of the pin fins 762, and to be slightly greater than the thickness d1 (see FIG. 9) of the body part 710 except for the pin fins 762. Moreover, the depth of each of the depressed portions 654B formed in the heat receiving block 650B, and the depth of each of the depressed portions (not shown) formed in the heat receiving block 650A, are set to be slightly greater than the height of each pin fin 762. Accordingly, even where the double-sided cooling power module 600 is sandwiched between the heat receiving blocks 650A, 650B as shown in FIG. 21 and the heat receiving blocks 650A, 650B are then secured by the securing members 604 to each other, no pressing force is applied to the double-sided cooling power module 600.

In the present modified example, the heat receiving blocks 650A, 650B combine the respective functions of the heat receiving spacers 630A, 630B and the heat receiving blocks 601A, 601B in the above embodiments, thereby making it possible to further suppress the entire thermal resistance. Also, since the number of components can be reduced, an advantage that manufacturing management becomes easier is also obtained. Note that, the space securing parts 652 in the present modified example are not necessarily formed integral with the heat receiving block 650B, and may be formed as separate members.

Figure 21:
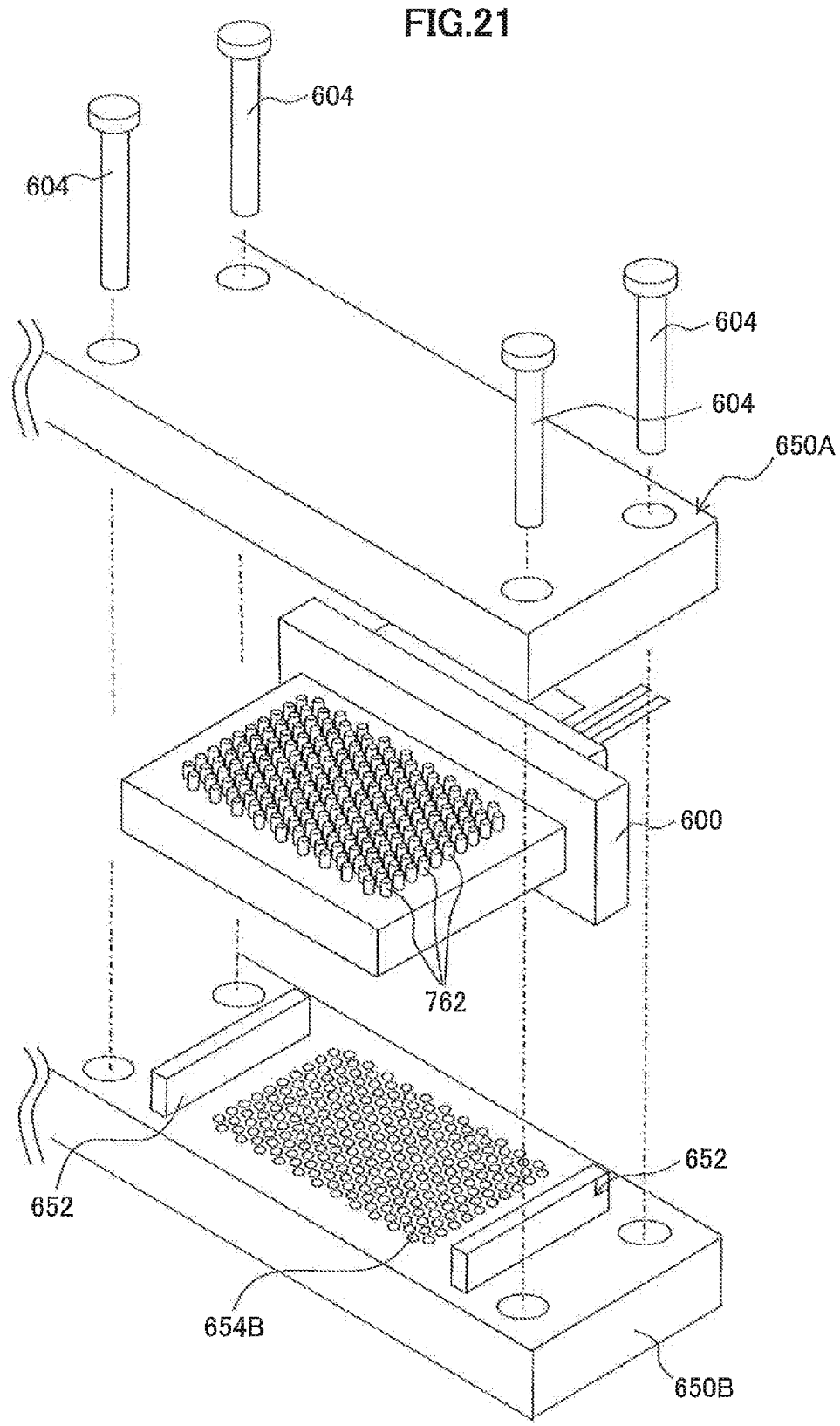
FIG. 21 is a view corresponding to the exploded view of the portion C in FIG. 10, in further another modified example of the heat receiving spacer.

(5) Although in the above embodiments, the through-holes 633A, 633B are formed in the heat receiving spacers 630A, 630B, depressed portions similar to the depressed portions 654B such as shown in FIG. 21 may be formed in place of the through-holes. In this case too, the depth of each depressed portion is set to be greater than the height of each pin fin 762.

(6) The heat receiving spacers 630A, 630B are preferably comprised of highly heat-conductive metal such as aluminum or copper from the standpoint of heat dissipation characteristics. However, where the double-sided cooling power module 600 and the cooler 610 need to be isolated from each other, material such as resin or ceramics may be used as the heat receiving spacers 630A, 630B.

(7) In the above embodiments, a flexible member such as a rubber plate may be inserted between the abutting faces of the space securing parts 632A, 632B. This also makes it possible to perform a minute height adjustment and a lessening in pressing.

(8) Although in the above embodiments, the heat pipes 602 and the heat dissipating fins 603 are used in the coolers 610A, 610B, a cooler may be used which does not include the heat pipes 602 and in which heat dissipating fins are directly joined to the heat receiving blocks 601A, 601B. Moreover, a liquid-cooled cooler may be adopted which allows refrigerant to flow through the inside thereof. More specifically, distribution channels for refrigerant joined to the heat receiving blocks 601A, 601B may be formed and heat dissipating fins may be joined to the distribution channels.

(9) Although in the above embodiments, the bolt and the nut are used as the securing member 604, a spring member or the like may be used.

(10) In the above embodiments, a heat conducting sheet may be used in place of the heat conducting grease 606.

(11) Although in the above embodiments, the cooling surfaces 760A, 760B of the double-sided cooling power module 600 are flat surfaces and the heat receiving parts 631A, 631B are in the form of a flat plate, the cooling surfaces 760A, 760B are not necessarily flat surfaces. More specifically, the shapes of the heat receiving parts 631A, 631B can be made the shapes complying with the cooling surfaces 760A, 760B, thereby obtaining the same advantageous effects as in the above embodiments.

(12) Although in the above embodiment in FIG. 10, the heat pipes 602 are inclined at about 10 degrees to the x-y plane (horizontal plane), the heat pipes 602 may be made flat with no inclination.

DESCRIPTION OF REFERENCE SIGNS

101: Cooling fan, 105: Transformer, 106: Storage cell, 107: Power receiving point, 108: Alternating current (AC) load, 109: Superordinate control circuit, 110C: Instruction signal to converter, 110I: Instruction signal to inverter, 110X: Instruction signal to chopper, 111: Cooling wind, 150: Power conversion device, 152: Converter, 153: Inverter, 154: Chopper, 201: Capacitor, 202: Converter gate controller, 204: Switching element, 205: Diode element, 253; Leg, 600: Double-sided cooling power module (Heating element), 601: Heat receiving block, 601A, 601B: Heat receiving block (Clamping member), 602: Heat pipe, 603: Heat dissipating fin, 604: Securing member, 606: Heat conducting grease, 610, 610A, 610B: Cooler, 620: Air-cooled double-sided cooling power unit, 630A, 630B: Heat receiving spacer, 631A, 631B: Heat receiving part (Heat receiving plate), 632A, 632B: Space securing part, 633A, 633B, 640A, 642A; Through-hole (Hole), 635, 637A, 637B, 639A, 639B; Gap, 650A, 650B: Heat receiving block (Clamping member), 652: Space securing part, 654B; Depressed portion, 710: Body part, 710a; End face, 720: Flange part, 730: Terminal part, 751: Gate terminal, 753: Insulator, 754N: N-terminal, 754P: P-terminal, 754AC: AC-terminal, 760A, 760B: Cooling surface, 762, 762A, 762B: Pin fin, 853: Cooling wind, 951: Capacitor, 952N; Negative terminal, 952P: Positive terminal, 953N; Negative fuse, 953P: Positive fuse, 954: Gate driver substrate, 955: P-N-AC-layer laminate bus bar, 955N: N-layer bus bar, 955P: P-layer bus bar, 955S: Insulating layer, 955AC: AC-layer bus bar, 960: Basic converter unit, 1051: Positive terminal, 1052: Negative terminal, 1053: P-N-layer phase-to-phase laminate bus bar

What is claimed is:
1. A cooling structure of a heating element, comprising:
the heating element having at least one cooling surface from which a plurality of pin fins project;
a heat receiving plate in which holes are formed at positions facing the pin fins, the pin fins being movably inserted into the holes;
a cooler which has a pair of clamping members that sandwich therebetween the heat receiving plate while pressing the heat receiving plate, and which cools the heat receiving plate; and
a space securing part which is provided on the heat receiving plate and suppresses a distance between the pair of clamping members so as not to apply a pressing force by the clamping members to the heating element.

2. The cooling structure of the heating element, according to claim 1, wherein
the heating element has the cooling surface on two opposite surfaces thereof, and
the heat receiving plate has a shape complying with the cooling surface on the two surfaces, the holes being formed at the positions facing each of the pin fins which project from the cooling surface on the two surfaces.

3. The cooling structure of the heating element, according to claim 1, further comprising a heat conducting agent filled between the pin fins and the heat receiving plate.

4. The cooling structure of the heating element, according to claim 1, wherein the distance between the pair of clamping members suppressed by the space securing part is greater than a thickness of the heating element inclusive of the pin fins.

5. The cooling structure of the heating element, according to claim 1, wherein each of the holes has a columnar shape.

6. The cooling structure of the heating element, according to claim 1, wherein some of the plurality of pin fins are movably inserted into one of the holes.

7. The cooling structure of the heating element, according to claim 1, wherein in the heat receiving plate, both of a hole into which some of the plurality of pin fins are movably inserted, and a hole into which one pin fin is movably inserted, are formed.

8. The cooling structure of the heating element, according to claim 1, wherein the cooler includes heat dissipating fins and heat pipes connected to the clamping members and the heat dissipating fins.

9. The cooling structure of the heating element, according to claim 1, wherein the cooler includes heat dissipating fins joined to the clamping members.

10. The cooling structure of the heating element, according to claim 1, wherein the cooler includes distribution channels for refrigerant joined to the clamping members, and heat dissipating fins joined to the distribution channels.

11. A cooling structure of a heating element, comprising:
the heating element having at least one cooling surface from which a plurality of pin fins project;
a pair of clamping members in each of which holes are formed at positions facing the pin fins, the pin fins being movably inserted into the holes, the clamping members sandwiching therebetween the heating element; and
a space securing part which suppresses a distance between the pair of clamping members so as not to apply a pressing force by the clamping members to the heating element.

12. A power converter unit comprising
a plurality of semiconductor devices for a power conversion device, each semiconductor device having cooling surfaces from which a plurality of pin fins project, on both opposite surfaces thereof, and having electric terminals on one side surface which abuts on the cooling surfaces;
a plurality of heat receiving plates in each of which holes are formed at positions facing the pin fins, the pin fins being movably inserted into the holes, and each of which is attached to a corresponding one of the cooling surfaces;
a plurality of coolers including a plurality of clamping members that sandwich therebetween the plurality of heat receiving plates while pressing the heat receiving plates, a plurality of heat dissipating fins that lie next to each other on the opposite side of the side surface having the electric terminals relative to each of the semiconductor devices for the power conversion device, and at least one heat pipe that connects the clamping members with a corresponding plurality of heat dissipating fins, the plurality of coolers cooling the plurality of heat receiving plates, respectively; and
a plurality of space securing parts which are provided for each of the plurality of heat receiving plates and suppress distances between the clamping members so as not to apply a pressing force by the clamping members to the semiconductor devices for the power conversion device, wherein
the side surfaces on which the plurality of semiconductor devices for the power conversion device have the electric terminals are arranged on the same plane, and cooling wind is fed by a blower to the plurality of heat dissipating fins from a reverse side of the same plane.

13. A power conversion device comprising
a plurality of power converter units, each being the power converter unit according to claim 12, the plurality of power converter units being arranged side by side to allow the coolers to lie next to each other.

* * * * *